United States Patent
Kang et al.

(10) Patent No.: US 10,998,327 B2
(45) Date of Patent: May 4, 2021

(54) SEMICONDUCTOR DEVICE INCLUDING SEPARATION LINES

(71) Applicant: SAMSUNG ELECTRONICS CO., LTD., Suwon-si (KR)

(72) Inventors: Su Bin Kang, Suwon-si (KR); Byoung Il Lee, Seoul (KR); Ji Mo Gu, Seoul (KR); Yu Jin Seo, Daejeon (KR); Tak Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 214 days.

(21) Appl. No.: 16/227,822

(22) Filed: Dec. 20, 2018

(65) Prior Publication Data

US 2019/0355736 A1   Nov. 21, 2019

(30) Foreign Application Priority Data

May 18, 2018 (KR) .................. 10-2018-0057263

(51) Int. Cl.

| | | |
|---|---|---|
| *H01L 27/11565* | (2017.01) | |
| *H01L 27/11524* | (2017.01) | |
| *H01L 27/11582* | (2017.01) | |
| *H01L 27/11519* | (2017.01) | |
| *H01L 27/1157* | (2017.01) | |
| *H01L 27/11556* | (2017.01) | |

(52) U.S. Cl.
CPC .... *H01L 27/11565* (2013.01); *H01L 27/1157* (2013.01); *H01L 27/11519* (2013.01); *H01L 27/11524* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,877,587 B2 | 11/2014 | Noh |
| 9,698,151 B2 | 7/2017 | Lee et al. |
| 2011/0233648 A1 | 9/2011 | Seol et al. |
| 2012/0119287 A1 | 5/2012 | Park et al. |
| 2012/0208347 A1 | 8/2012 | Hwang et al. |
| 2012/0261722 A1* | 10/2012 | Tang .................. H01L 27/249 257/202 |

(Continued)

*Primary Examiner* — Lex H Malsawma
(74) *Attorney, Agent, or Firm* — F. Chau & Associates, LLC

(57) ABSTRACT

A semiconductor device includes a stacked structure disposed on a substrate. The stacked structure includes a plurality of gate electrodes. The semiconductor device further includes a first structure disposed on the substrate and passing through the stacked structure, and a second structure disposed on the substrate. The second structure is disposed outside of the stacked structure, faces the first structure, and is spaced apart from the first structure. The first structure includes a plurality of separation lines passing through at least a portion of the plurality of gate electrodes and extending outside of the stacked structure, and the second structure is formed of the same material as the first structure.

20 Claims, 30 Drawing Sheets

(56) References Cited

U.S. PATENT DOCUMENTS

| | | | |
|---|---|---|---|
| 2013/0126957 A1* | 5/2013 | Higashitani | H01L 27/11565 257/314 |
| 2015/0372101 A1 | 12/2015 | Lee et al. | |
| 2016/0268287 A1 | 9/2016 | Park et al. | |
| 2017/0104000 A1 | 4/2017 | Park et al. | |
| 2017/0179026 A1* | 6/2017 | Toyama | H01L 27/11573 |
| 2017/0186767 A1 | 6/2017 | Baek et al. | |
| 2017/0194346 A1 | 7/2017 | Lee et al. | |
| 2017/0278571 A1* | 9/2017 | Chowdhury | G11C 16/0483 |
| 2018/0342455 A1* | 11/2018 | Nosho | H01L 27/11575 |
| 2018/0374865 A1* | 12/2018 | Shimabukuro | H01L 29/66553 |

* cited by examiner

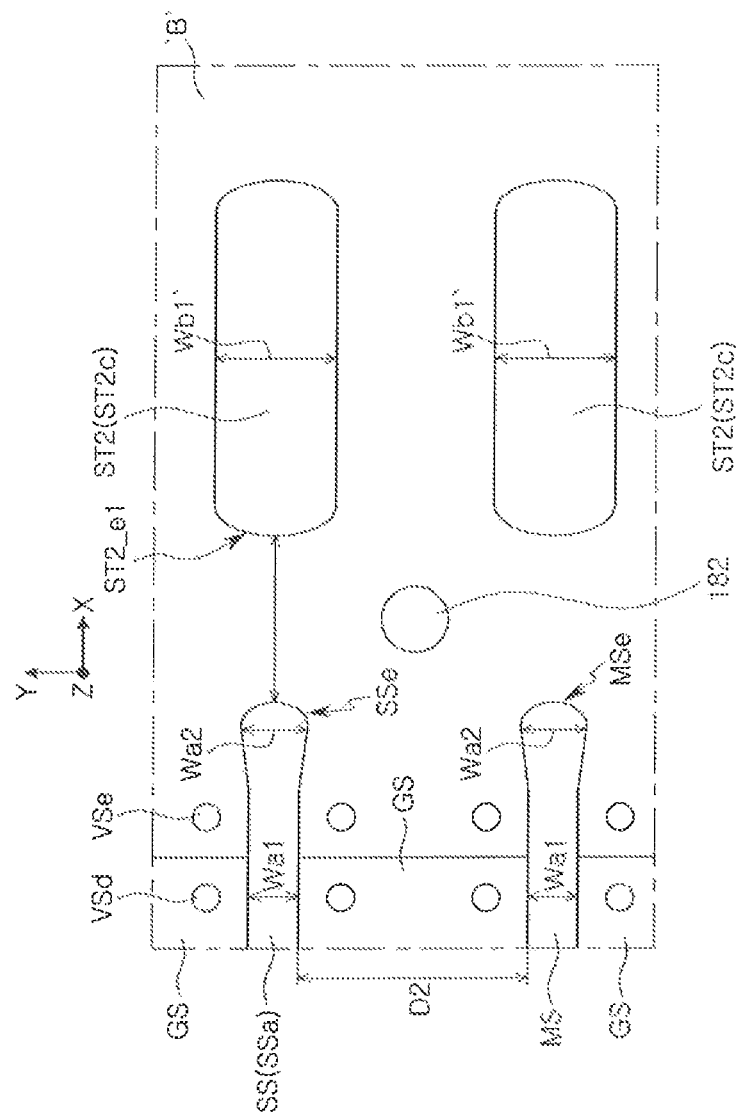

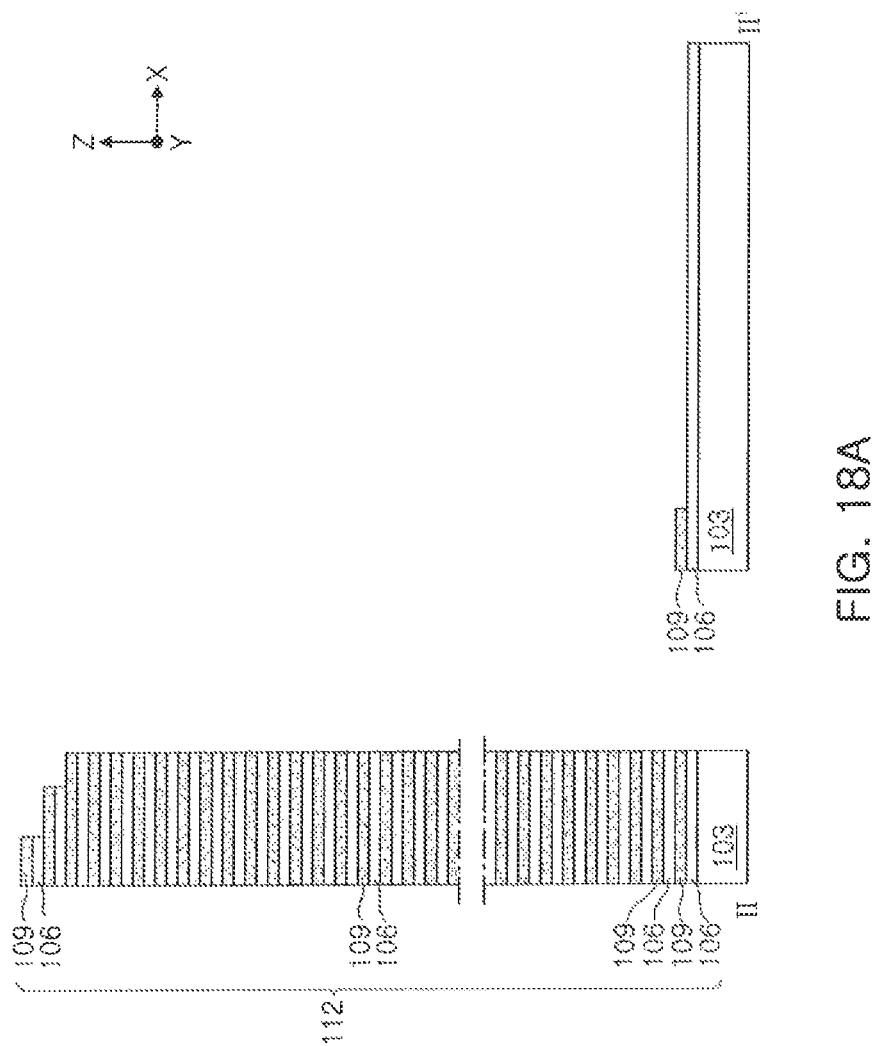

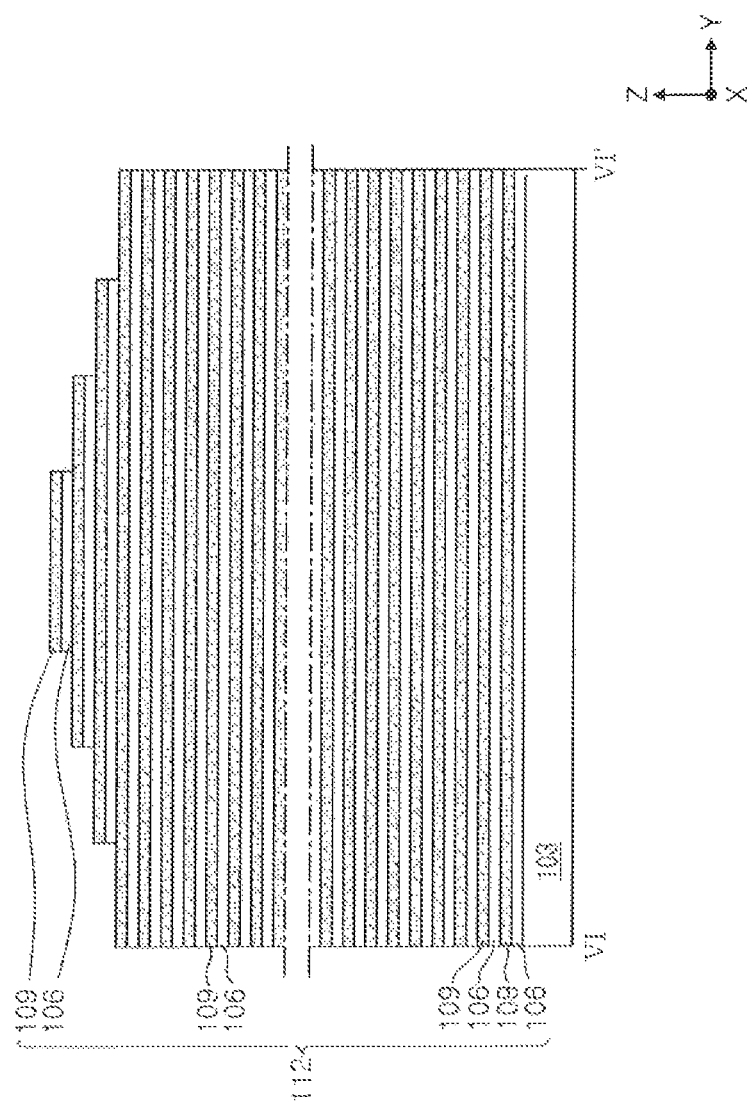

SEMICONDUCTOR DEVICE INCLUDING SEPARATION LINES

CROSS-REFERENCE TO RELATED APPLICATIONS

This application claims priority under 35 U.S.C. § 119 to Korean Patent Application No. 10-2018-0057263 filed on May 18, 2018 in the Korean Intellectual Property Office, the disclosure of which is incorporated by reference herein in its entirety.

TECHNICAL FIELD

Exemplary embodiments of the present inventive concept relate to a semiconductor device, and more particularly, to a semiconductor device including a stacked structure and separation lines passing through the stacked structure.

DISCUSSION OF THE RELATED ART

There is growing demand to increase the degree of integration of semiconductor devices. To improve the degree of integration of semiconductor devices, a three-dimensional semiconductor device in which gates are stacked in a vertical direction of a substrate has been developed. As the degree of integration increases, the number of stacked gates in a three-dimensional semiconductor device also increases.

SUMMARY

Exemplary embodiments of the present inventive concept provide a semiconductor device including a separation line and a structure capable of improving yield and productivity.

According to an exemplary embodiment of the present inventive concept, a semiconductor device includes a stacked structure disposed on a substrate. The stacked structure includes a plurality of gate electrodes. The semiconductor device further includes a first structure disposed on the substrate and passing through the stacked structure, and a second structure disposed on the substrate. The second structure is disposed outside of the stacked structure, faces the first structure, and is spaced apart from the first structure. The first structure includes a plurality of separation lines passing through at least a portion of the plurality of gate electrodes and extending outside of the stacked structure, and the second structure is formed of the same material as the first structure.

According to an exemplary embodiment of the present inventive concept, a semiconductor device includes a stacked structure disposed on a substrate. The stacked structure includes a plurality of gate electrodes. The semiconductor device further includes a plurality of main separation lines passing through the stacked structure in a first direction substantially perpendicular to an upper surface of the substrate, extending in a second direction substantially parallel to the upper surface of the substrate and intersecting the stacked structure, and having edge end portions located outside of the stacked structure. The semiconductor device further includes a plurality of first secondary separation lines passing through the stacked structure in the first direction, extending in the second direction, and having edge end portions located on outer sides of the stacked structure. The semiconductor device further includes a plurality of second secondary separation lines passing through the stacked structure in the first direction, and having inside end portions facing the first secondary separation lines. The semiconductor device further includes a structure facing the edge end portions of the main separation lines and the edge end portions of the first secondary separation lines. Upper surfaces of the structure are coplanar with upper surfaces of the main separation lines and upper surfaces of the first secondary separation lines.

According to an exemplary embodiment of the present inventive, a semiconductor device includes a memory array region disposed on a substrate, and an extension region disposed adjacent to the memory array region. The semiconductor device further includes a stacked structure disposed in the memory array region and the extension region. The stacked structure includes a plurality of gate electrodes spaced apart from one another and stacked in a first direction in the memory array region. The first direction is substantially perpendicular to an upper surface of the substrate. The gate electrodes extend into the extension region and include a plurality of pads disposed in a stepped shape in the extension region. The semiconductor device further includes a plurality of memory vertical structures extending in the first direction and passing through the gate electrodes in the memory array region, a plurality of main separation lines intersecting the memory array region and the extension region and separating the stacked structure in a second direction, and a plurality of secondary separation lines passing through the stacked structure in the extension region. The semiconductor device further includes a structure disposed on the substrate and disposed outside of the stacked structure. The main separation lines and the secondary separation lines include edge end portions extending in a third direction from the extension region and located on outer sides of the stacked structure. The structure includes outer side end portions facing the edge end portions. Upper surfaces of the main separation lines, the secondary separation lines, and the structure are coplanar with one another and formed of the same material.

BRIEF DESCRIPTION OF THE DRAWINGS

The above and other features of the present inventive concept will become more apparent by describing in detail exemplary embodiments thereof with reference to the accompanying drawings, in which:

FIG. 12C is a partially enlarged plan view illustrating region 'B' in FIG. 11 according to an exemplary embodiment of the present inventive concept.

FIGS. 18A, 19A, and 20A are cross-sectional views taken along lines I-I' and II-II' in FIG. 4 according to an exemplary embodiment of the present inventive concept.

FIGS. 18C, 19C, and 20C are cross-sectional views taken along line VI-VI' in FIG. 4 according to an exemplary embodiment of the present inventive concept.

DETAILED DESCRIPTION

Figure 1A:
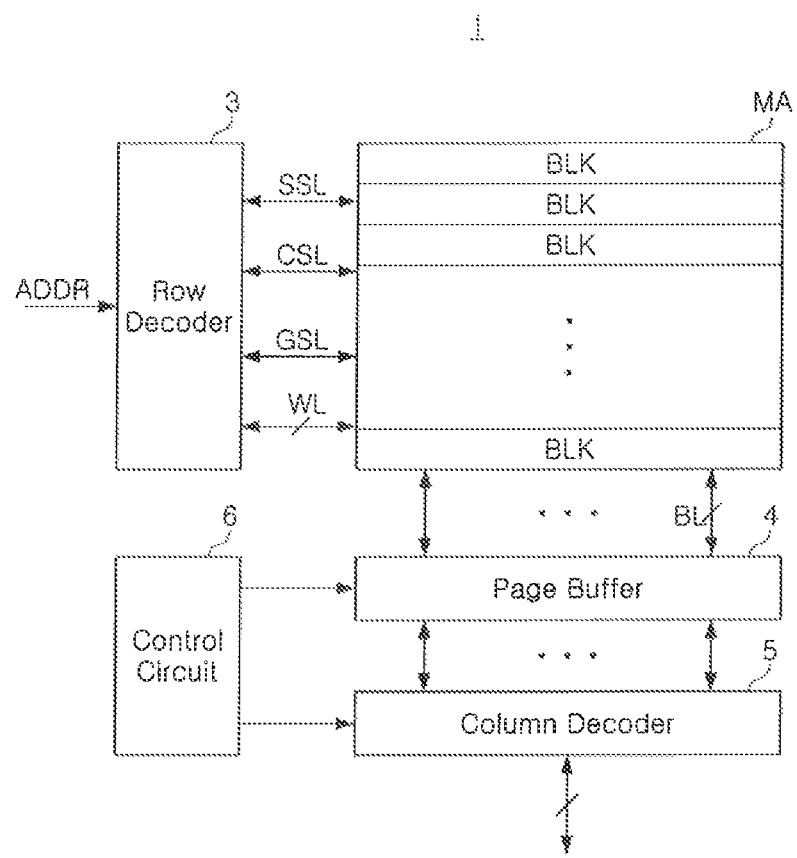
FIG. 1A is a schematic block diagram of a semiconductor device according to an exemplary embodiment of the present inventive concept.

Exemplary embodiments of the present inventive concept will be described more fully hereinafter with reference to the accompanying drawings. Like reference numerals may refer to like elements throughout the accompanying drawings.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. In addition, it will also be understood that when a layer is referred to as being "between" two layers, it can be the only layer between the two layers, or one or more intervening layers may also be present.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It will be further understood that when two components and/or directions are described as extending substantially parallel or perpendicular to each other, the two components and/or directions extend exactly parallel or perpendicular to each other, or extend approximately parallel or perpendicular to each other within a measurement error as would be understood by a person having ordinary skill in the art. Further, when two or more elements or values are described as being substantially the same as or about equal to each other, it is to be understood that the elements or values are identical to each other, indistinguishable from each other, or distinguishable from each other but functionally the same as each other as would be understood by a person having ordinary skill in the art.

An exemplary embodiment of a semiconductor device according to an exemplary embodiment of the present inventive concept will be described with reference to FIG. 1A.

FIG. 1A is a schematic block diagram of a semiconductor device according to an exemplary embodiment of the present inventive concept.

Referring to FIG. 1A, a semiconductor device 1 according to an exemplary embodiment may include a memory array region MA, a row decoder 3, a page buffer 4, a column decoder 5, and a control circuit 6. The memory array region MA may include memory blocks BLK.

The memory array region MA may include memory cells disposed in a plurality of rows and columns. The memory cells included in the memory array region MA may include word lines WL, at least one common source line CSL, string selection lines SSL, and at least one ground selection line GSL. The memory cells may be electrically connected to the page buffer 4 and the column decoder 5 through bit lines BL.

In an exemplary embodiment, among the memory cells, the memory cells disposed on the same row may be connected to the same word line WL, and the memory cells disposed in the same column may be connected to the same bit line BL.

The row decoder 3 may be commonly connected to the memory blocks BLK and may provide a driving signal to the word lines WL of the memory blocks BLK selected in response to a block selection signal. For example, the row decoder 3 may receive address information ADDR from the outside, and decode the received address information ADDR to determine a voltage supplied to at least a portion of the word lines WL, the common source line CSL, the string selection lines SSL, and the ground selection line GSL that are electrically connected to the memory blocks BLK.

The page buffer 4 may be electrically connected to the memory array region MA through the bit lines BL. The page buffer 4 may be connected to the selected bit line BL according to the decoded address from the column decoder 5. The page buffer 4 may temporarily store data to be stored in the memory cells, or sense data stored in the memory cells according to an operation mode. For example, the page buffer 4 may operate as a writing driver circuit in a program operation mode, and as a sense amplifier circuit in a reading operation mode. The page buffer 4 may receive power (e.g., voltage or current) from the control logic, and provide the power to the selected bit line BL.

The column decoder 5 may provide a data transmission path between the page buffer 4 and an external device (for example, a memory controller). The column decoder 5 may decode an externally input address to select any one of the bit lines BL.

The column decoder 5 may be commonly connected to the memory blocks BLK, and may provide data information to the bit lines BL of the selected memory block BLK in response to a block selection signal.

The control circuit 6 may control the overall operation of the semiconductor device 1. The control circuit 6 may receive the control signal and the external voltage, and may operate in response to the received control signal. The control circuit 6 may include a voltage generator that generates voltages necessary for internal operations (e.g., a program voltage, a read voltage, an erase voltage, etc.) using an external voltage. The control circuit 6 may control the reading, writing, and/or erasing operations in response to control signals.

An illustrative example of the circuit of the memory array region (MA in FIG. 1A) of the semiconductor device 1 described in FIG. 1A will be described with reference to FIG. 1B.

Figure 1B:
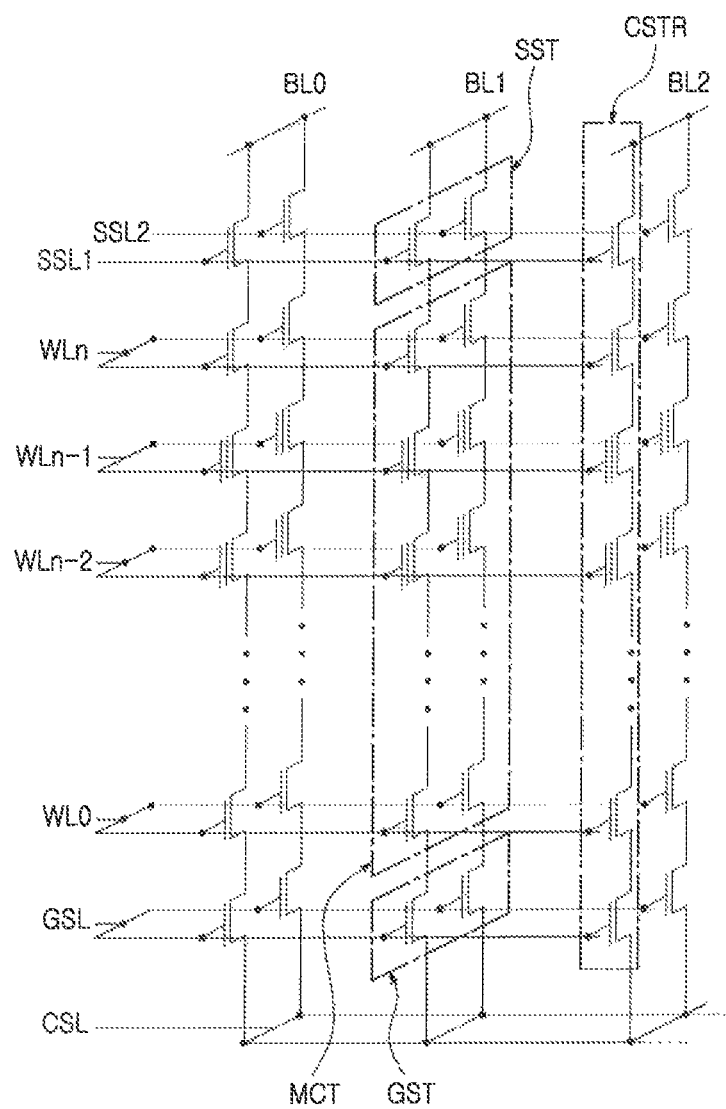
FIG. 1B is a circuit diagram conceptually illustrating a memory array region of a semiconductor device according to an exemplary embodiment of the present inventive concept.

FIG. 1B is a circuit diagram conceptually illustrating the memory array region MA in FIG. 1A.

Referring to FIG. 1B, a semiconductor device according to an exemplary embodiment may include a common source line CSL, bit lines BL0 to BL2, and a plurality of cell strings CSTR disposed between the common source line CSL and the bit lines BL0 to BL2. The plurality of cell strings CSTR may be connected to the respective bit lines BL0 to BL2 in parallel. The plurality of cell strings CSTR may be connected to the common source line CSL in common. Each of the plurality of cell strings CSTR may include a lower selection transistor GST, memory cells MCT, and an upper selection transistor SST, which may be connected in series.

The memory cells MCT may be connected between the lower selection transistor GST and the upper selection transistor SST in series. Each of the memory cells MCT may include data storage regions capable of storing information.

The upper selection transistor SST may be electrically connected to the bit lines BL0 to BL2, and the lower selection transistor GST may be electrically connected to the common source line CSL.

The upper selection transistor SST may be disposed in plural, and controlled by string selection lines SSL1 to SSL2. The memory cells MCT may be controlled by a plurality of word lines WL0 to WLn, in which n is a positive integer.

The lower selection transistor GST may be controlled by a ground selection line GSL. The common source line CSL may be connected to a source of the ground selection transistor GST in common.

In an exemplary embodiment, the upper selection transistor SST may be a string selection transistor, and the lower selection transistor GST may be a ground selection transistor.

Figure 2:
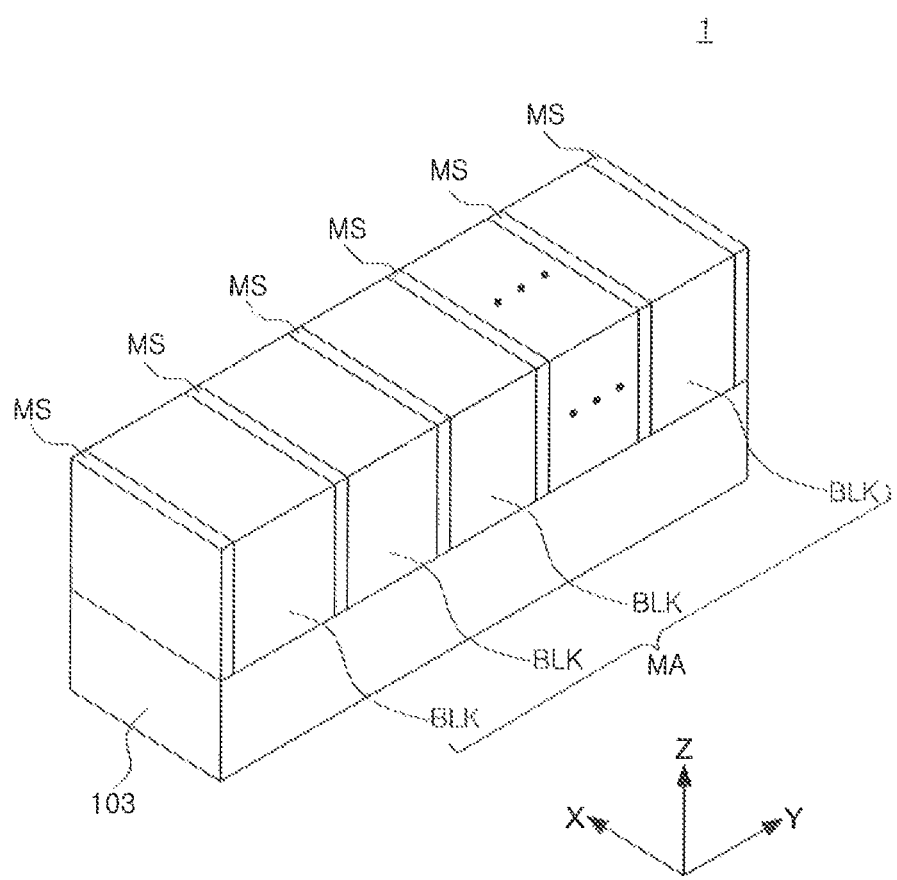
FIG. 2 is a block diagram schematically illustrating a semiconductor device according to an exemplary embodiment of the present inventive concept.

FIG. 2 is a block diagram schematically illustrating memory blocks BLK in the memory array region MA described in FIG. 1, in a semiconductor device according to an exemplary embodiment of the present inventive concept.

Referring to FIG. 2, the plurality of memory blocks BLK of the memory array region MA described in FIG. 1 may extend in a first direction X, and may be disposed in sequence while being separated from each other in a second direction Y. The memory array region MA including the memory blocks BLK may be disposed on a substrate 103. The first and second directions X and Y may be substantially parallel to the upper surface of the substrate 103, and the second direction Y may be a direction substantially perpendicular to the first direction X.

The memory blocks BLK may be disposed between main separation lines MS disposed on the substrate 103. Each of the memory blocks BLK may be disposed between a pair of adjacent main separation lines MS. Thus, the memory blocks BLK may be separated and spaced in the second direction Y by the main separation lines MS.

An example of a semiconductor device according to an exemplary embodiment of the present inventive concept will now be described with reference to FIGS. 3A, 3B and 4 to 10.

Figure 3A:
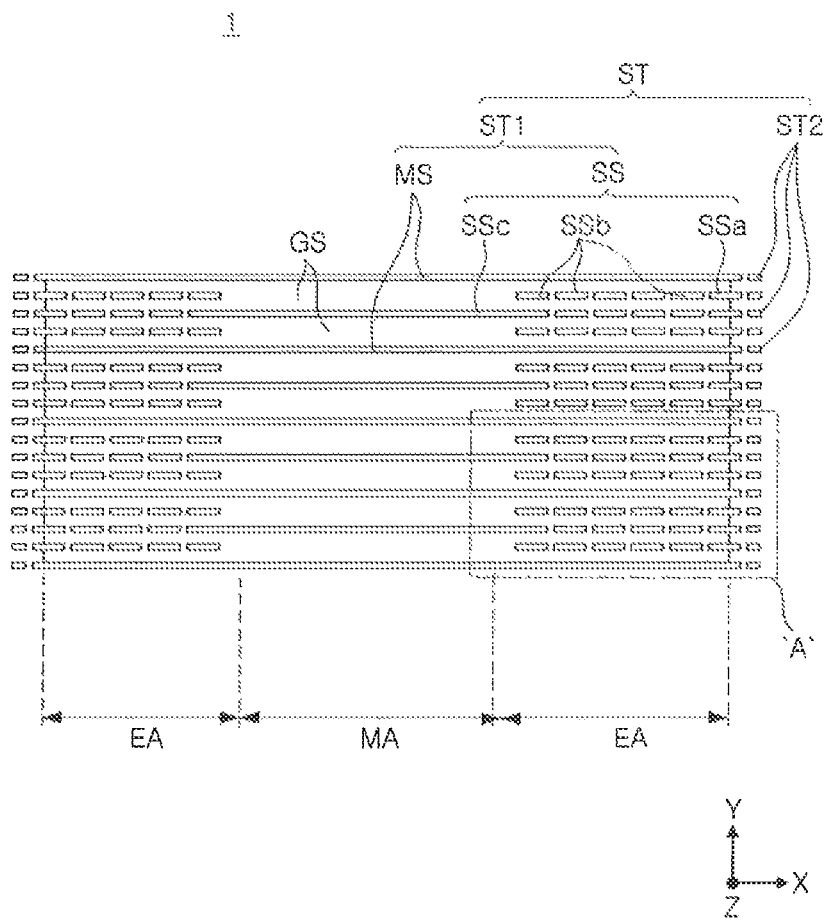
FIG. 3A is a plan view illustrating a semiconductor device according to an exemplary embodiment of the present inventive concept.
Figure 3B:
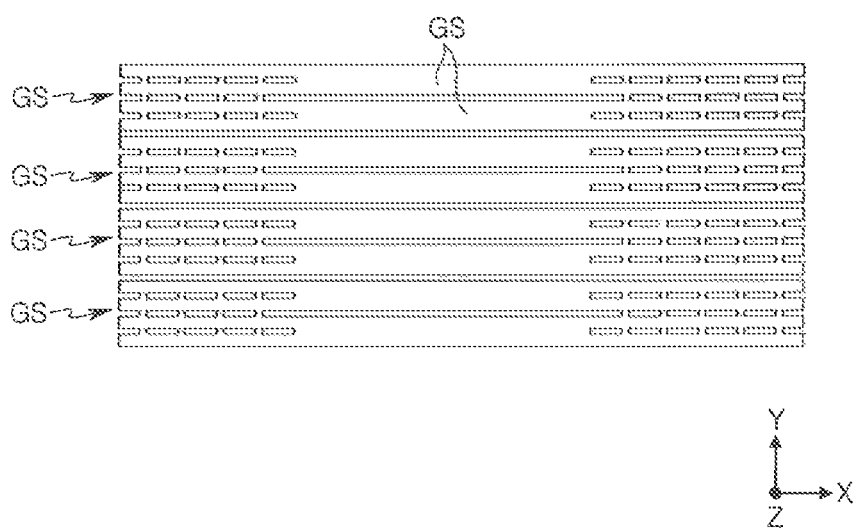
FIG. 3B is a plan view illustrating the stacked structure of FIG. 3A according to an exemplary embodiment of the present inventive concept.
Figure 4:
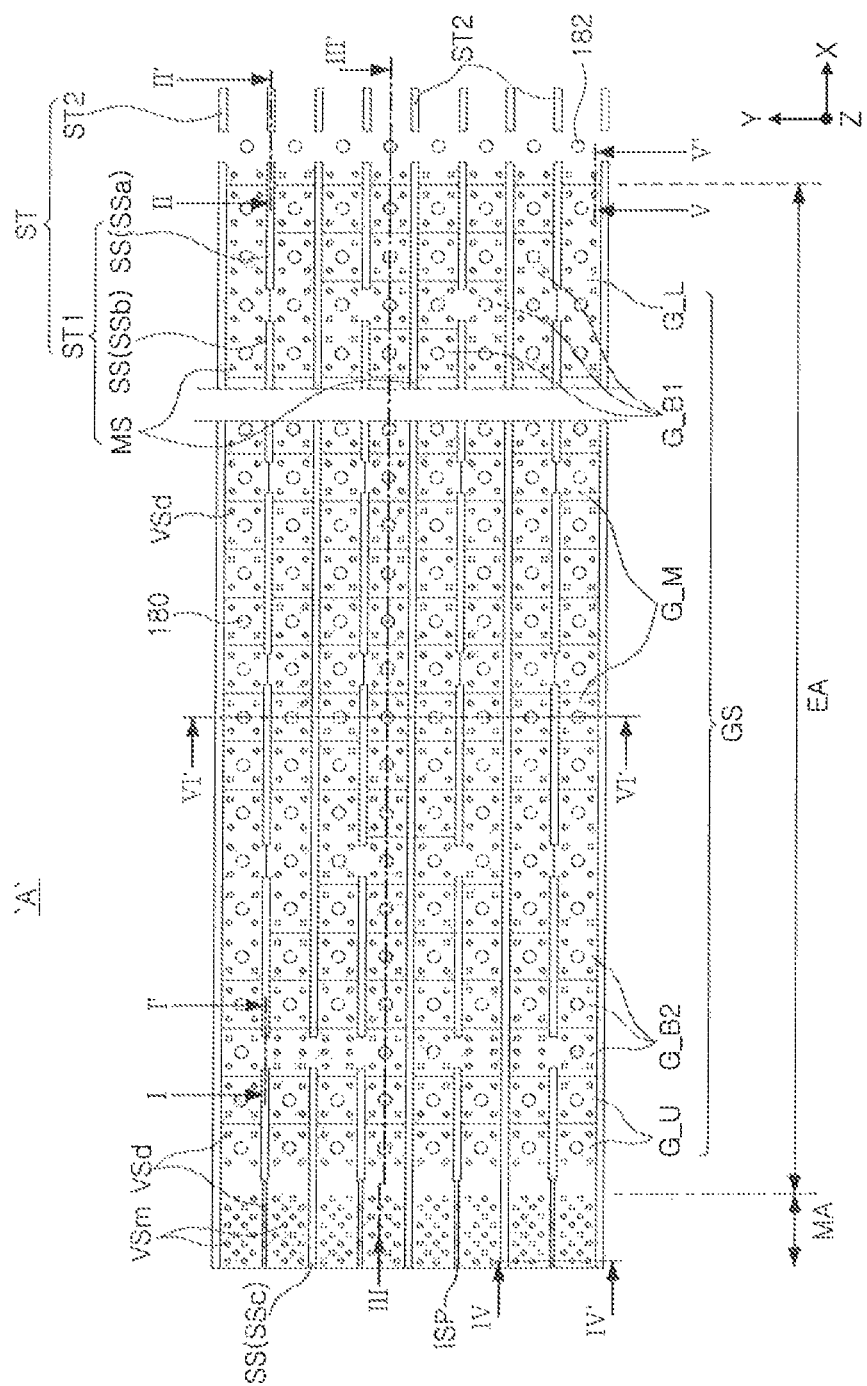
FIG. 4 is a partially enlarged plan view illustrating region 'A' in FIG. 3A according to an exemplary embodiment of the present inventive concept.
Figure 5:
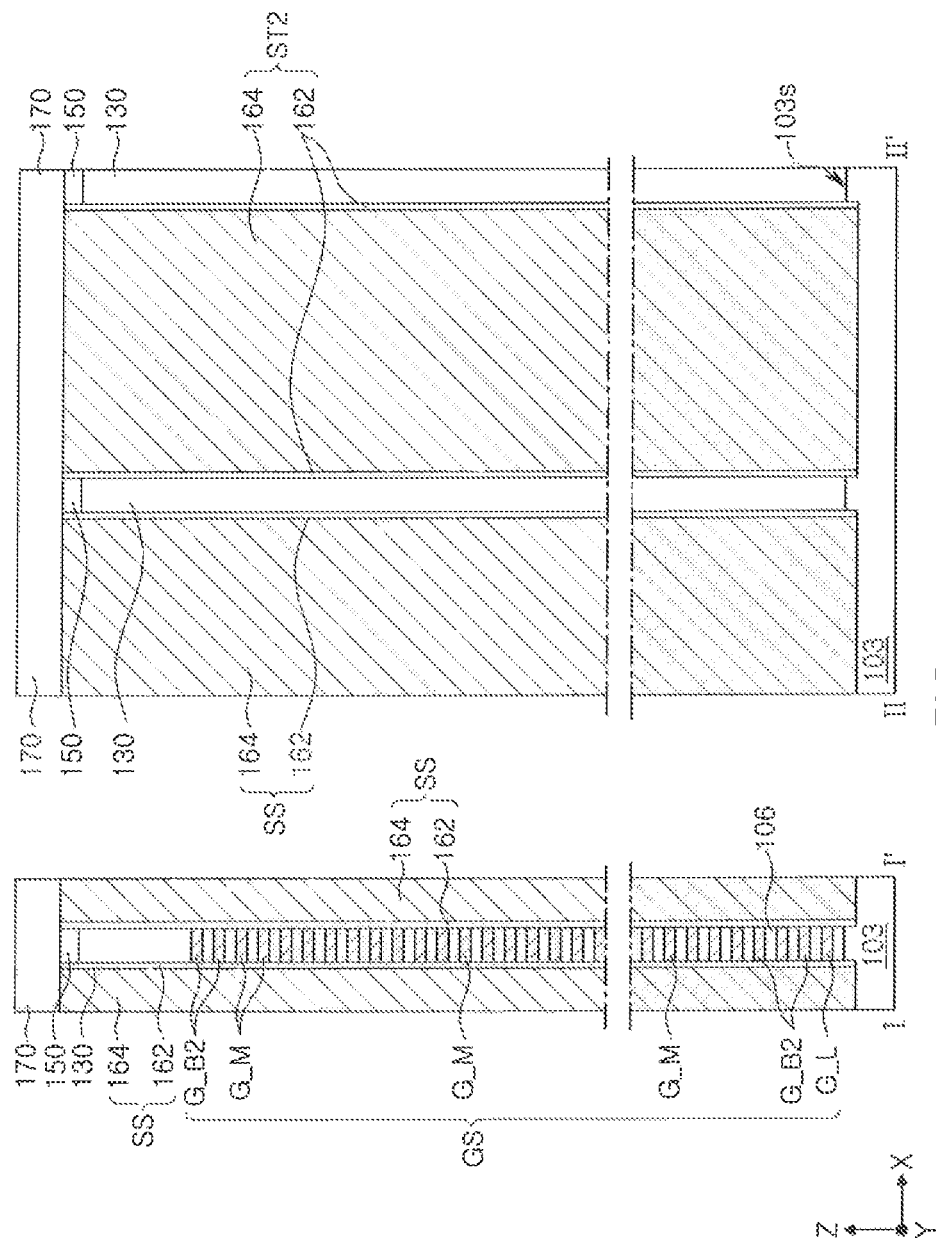
FIG. 5 is a cross-sectional view taken along lines I-I' and II-IF in FIG. 4 according to an exemplary embodiment of the present inventive concept.
Figure 6:
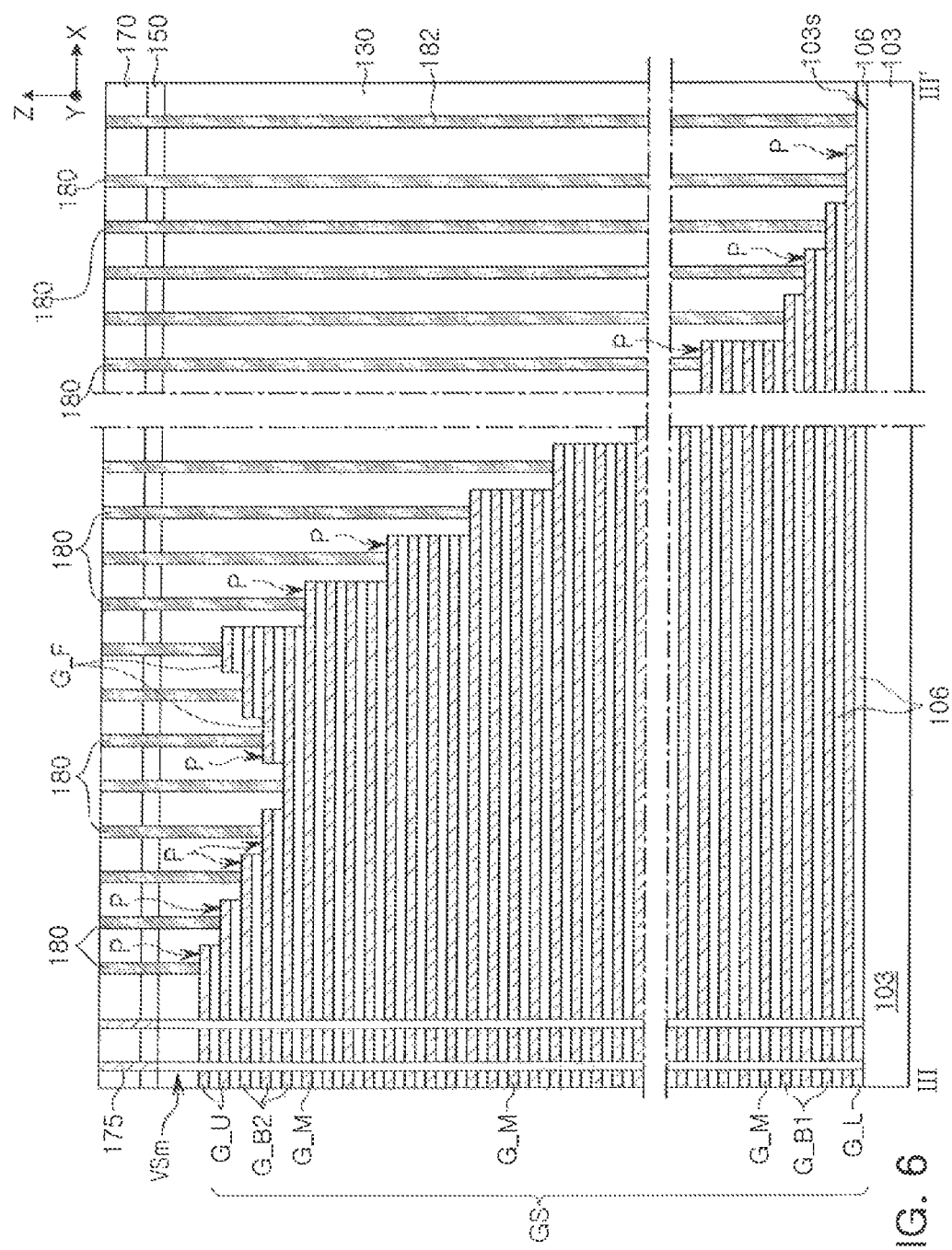
FIG. 6 is a cross-sectional view taken along line III-III' in FIG. 4 according to an exemplary embodiment of the present inventive concept.
Figure 7:
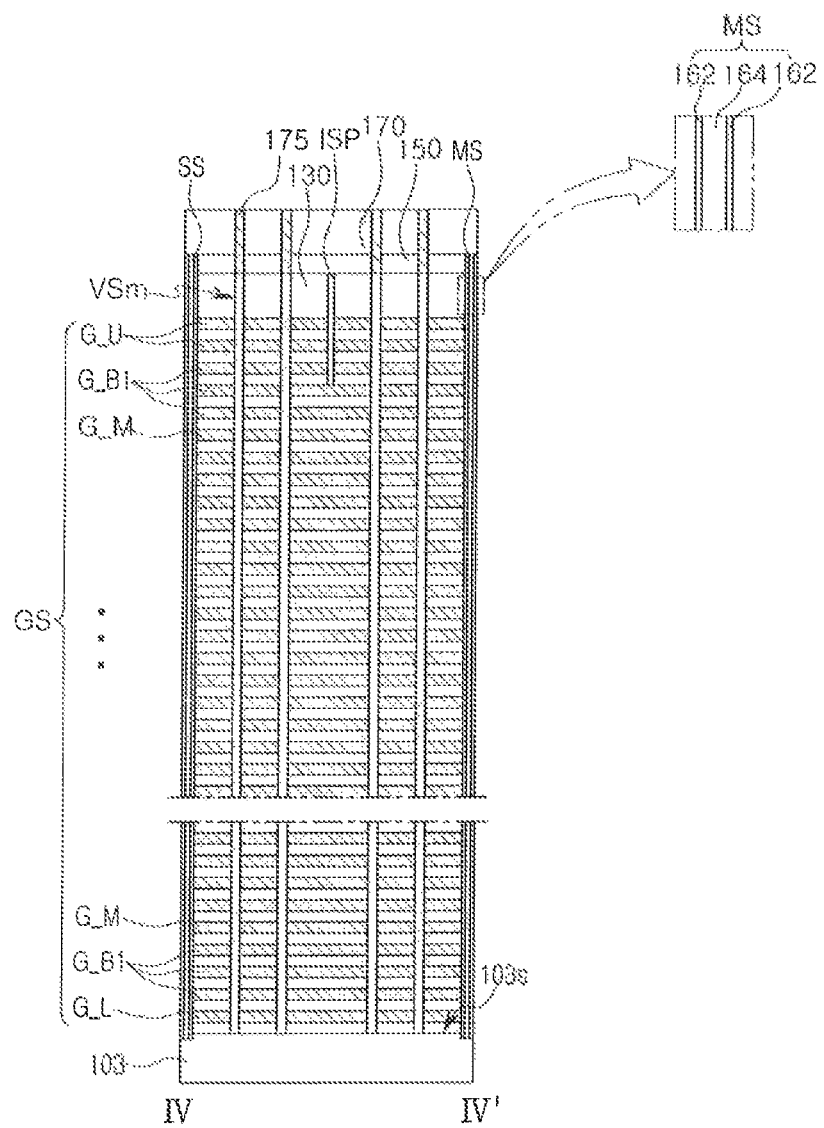
FIG. 7 is a cross-sectional view taken along line IV-IV' in FIG. 4 according to an exemplary embodiment of the present inventive concept.
Figure 8:
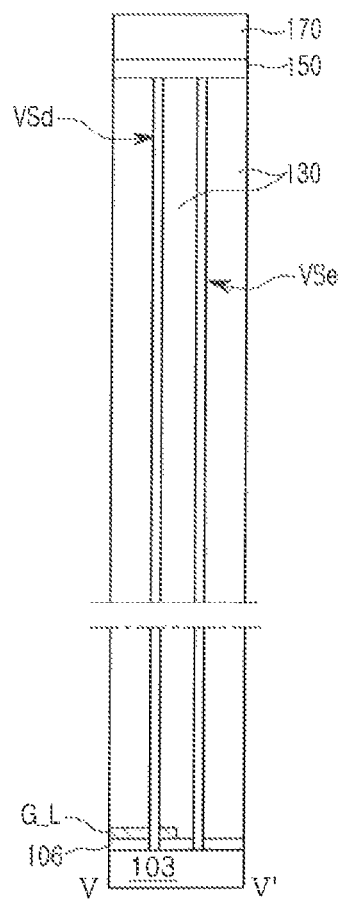
FIG. 8 is a cross-sectional view taken along line V-V' in FIG. 4 according to an exemplary embodiment of the present inventive concept.
Figure 9:
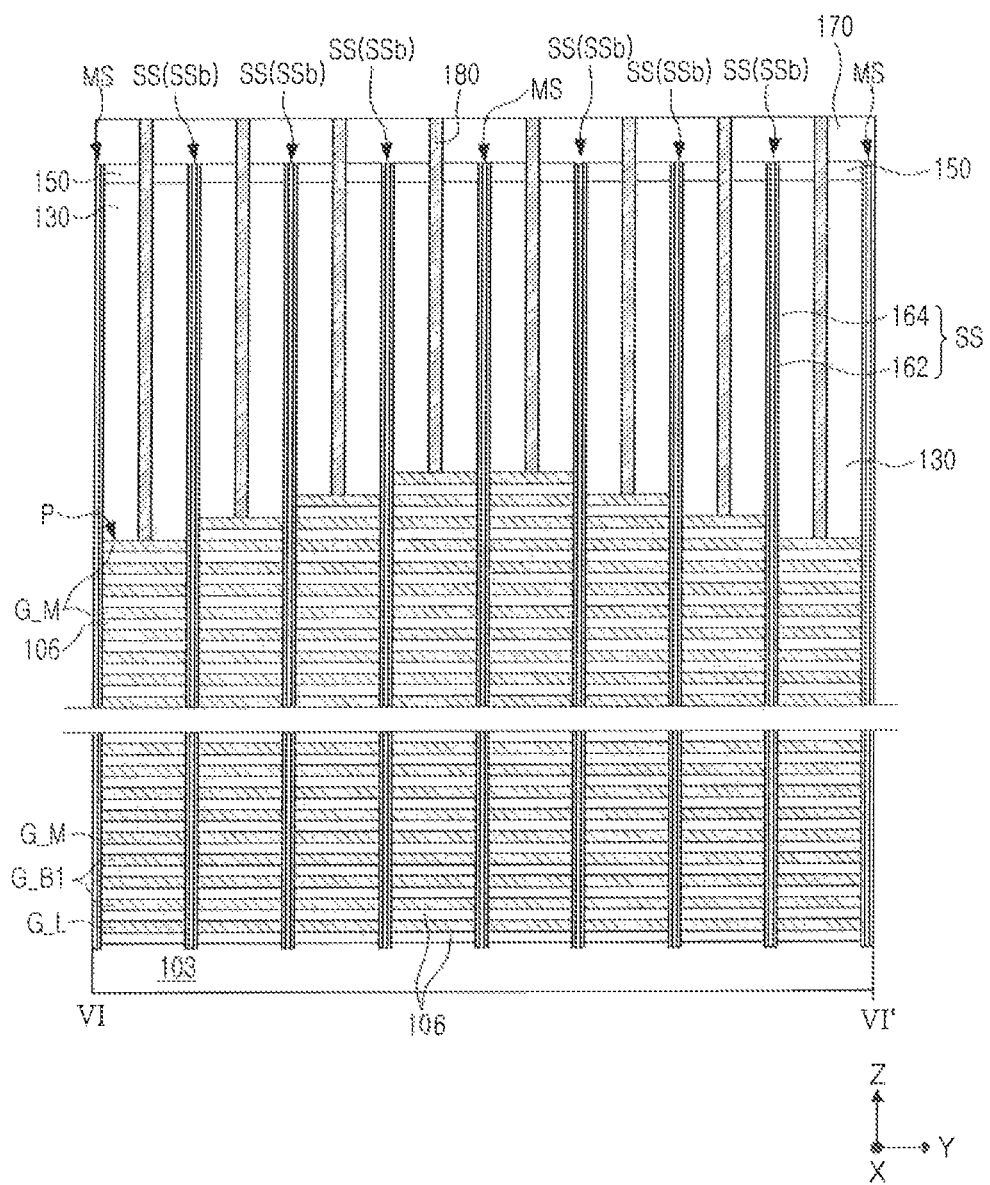
FIG. 9 is a cross-sectional view taken along line VI-VI' in FIG. 4 according to an exemplary embodiment of the present inventive concept.
Figure 10:
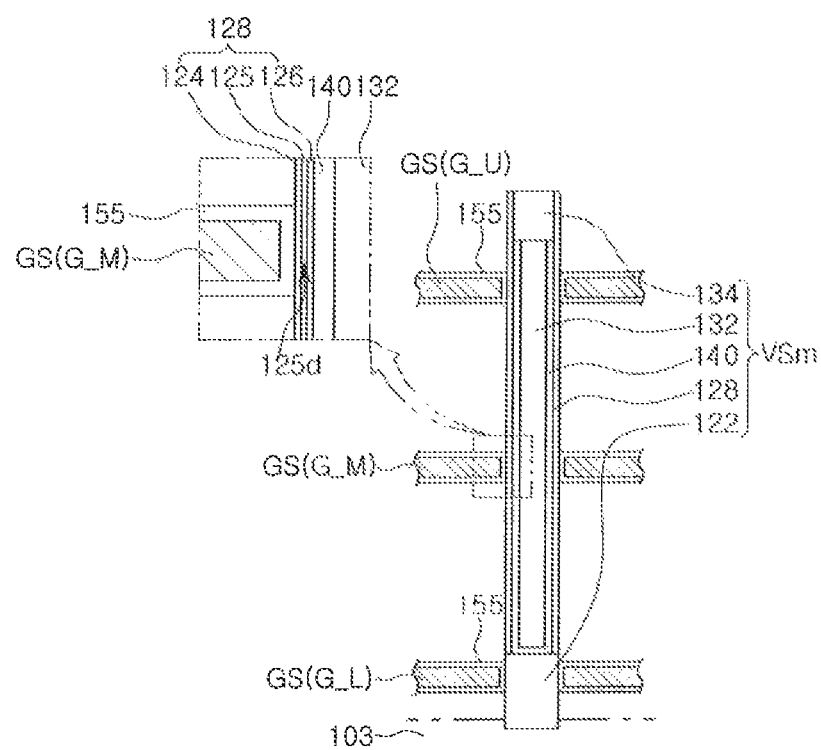
FIG. 10 is a conceptual cross-sectional view illustrating a portion of components of a semiconductor device according to an exemplary embodiment of the present inventive concept.

FIG. 3A is a plan view illustrating a semiconductor device according to an exemplary embodiment of the present inventive concept. FIG. 3B is a plan view illustrating the stacked structure of FIG. 3A according to an exemplary embodiment of the present inventive concept. FIG. 4 is a partially enlarged plan view illustrating region 'A' in FIG. 3A according to an exemplary embodiment of the present inventive concept. FIG. 5 is a cross-sectional view taken along lines I-I' and II-II' in FIG. 4 according to an exemplary embodiment of the present inventive concept. FIG. 6 is a cross-sectional view taken along line III-III' in FIG. 4 according to an exemplary embodiment of the present inventive concept. FIG. 7 is a cross-sectional view taken along line IV-IV' in FIG. 4 according to an exemplary embodiment of the present inventive concept. FIG. 8 is a cross-sectional view taken along line V-V' in FIG. 4 according to an exemplary embodiment of the present inventive concept. FIG. 9 is a cross-sectional view taken along line VI-VI' in FIG. 4 according to an exemplary embodiment of the present inventive concept. FIG. 10 is a conceptual cross-sectional view illustrating a portion of components of a semiconductor device according to an exemplary embodiment of the present inventive concept.

Hereinafter, an exemplary embodiment of the present inventive concept will be described with reference to FIGS. 3A to 10, together with the above description with reference to FIGS. 1A, 1B, and 2.

Referring to FIGS. 3A to 10, a structure ST including a first structure ST1, a second structure ST2, and a stacked structure GS, may be disposed on a substrate 103. The substrate 103 may be a semiconductor substrate that may be formed of a semiconductor material such as, for example, silicon.

The first structure ST1 may include main separation lines MS and secondary separation lines SS.

The main separation lines MS may have a linear shape extending in a first direction X. The stacked structures GS may be disposed between the main separation lines MS. The stacked structure GS may be disposed on the substrate 103. Each of the stacked structures GS may be disposed between a pair of main separation lines MS adjacent to each other from among the plurality of main separation lines MS. For example, one stacked structure GS may be disposed between a pair of adjacent main separation lines MS.

The main separation lines MS may have a linear shape passing through the stacked structures GS in a vertical direction Z substantially perpendicular to an upper surface 103s of the substrate 103, and intersecting the stacked structures GS in the first direction X. Therefore, the main separation lines MS may separate and space apart the stacked structures GS in the second direction Y. The first direction X and the second direction Y may be directions substantially parallel to the upper surface 103s of the substrate 103. The first direction X and the second direction Y may be substantially perpendicular to each other.

A length of each of the plurality of main separation lines MS in the first direction X may be greater than a length of each of the stacked structures GS in the first direction X.

The secondary separation lines SS may be disposed between the main separation lines MS. The secondary separation lines SS may pass through the stacked structures GS. The secondary separation lines SS may be spaced apart from one another.

The secondary separation lines SS may include first secondary separation lines SSa, second secondary separation lines SSb, and third secondary separation lines SSc.

The first secondary separation lines SSa may pass through the stacked structures GS, and extend in an outer direction of the stacked structures GS, for example, in the first direction X. The second and third secondary separation lines SSb and SSc may pass through the stacked structures GS.

The first structure ST1 may include line-shaped separation lines MS and SS extending in the outer direction of the stacked structure GS. For example, the separation lines MS and SS may be the main separation lines MS and the first secondary separation lines SSa.

The second structure ST2 may be disposed on the substrate 103, and disposed outwardly of (e.g., outside of) the stacked structures GS. For example, a second structure ST2 may be disposed adjacent to a nearest stacked structure GS without being a part of the nearest stacked structure GS. For example, as shown in FIG. 4, the second structure ST2 is disposed adjacent to the stacked structure GS. Further, the second structure ST2 may be spaced apart from the first structure ST1 while facing the first structure ST1.

In an exemplary embodiment, the second structure ST2 may be a structure having end portions facing end portions of the line-shaped separation lines MS and SS extending in an outer direction of the stacked structure GS of the first structure ST1. The second structure ST2 may have a bar shape extending in the first direction X. The second structure ST2 may be a bar-shaped structure corresponding one-to-one with the line-shaped separation lines MS and SS of the first structure ST1 extending in the outer direction of the stacked structure GS. In an exemplary embodiment, widths of the bar-shaped structures of the second structure ST2 in the second direction Y may be substantially identical to widths of the main separation lines MS and the secondary separation lines SS.

Referring primarily to FIGS. 5, 7, and 9, a second structure ST2 may be formed of the same material as that of a first structure ST1 including main separation lines MS and secondary separation lines SS. Each of the first and second structures ST1 and ST2 may include a separation core pattern 164 and an insulating spacer 162 surrounding side surfaces of the separation core pattern 164. The separation core pattern 164 may be formed of a conductive material and may contact the substrate 103. In an exemplary embodiment, the separation core pattern 164 may be formed of a conductive material including at least one of, for example, doped polysilicon, metal nitride (e.g., TiN), metal silicide (e.g., WSi, TiSi, TaSi, or the like), or metal (e.g., W). The insulating spacer 162 may be formed of an insulating material such as, for example, silicon oxide or the like. The first and second structures ST1 and ST2 may have upper surfaces forming a coplanar surface. The first and second structures ST1 and ST2 may extend into the substrate 103. The second structure ST2, the main separation lines MS, and the secondary separation lines SS may have a cross-sectional shape formed of the same components.

Referring to FIGS. 3A to 10, each of the stacked structures GS may include gate electrodes G_L, G_B1, G_M, G_B2, and G_U, which may be stacked while being spaced apart from one another in a vertical direction Z substantially perpendicular to the upper surface 103s of the substrate 103. Interlayer insulating layers 106 may be disposed between the gate electrodes G_L, G_B1, G_M, G_B2, and G_U. An interlayer insulating layer 106 may be disposed between a lowermost gate electrode G_L and the substrate 103. The gate electrodes G_L, G_B1, G_M, G_B2, and G_U may be formed of a conductive material including at least one of, for example, doped polysilicon, metal nitride (e.g., TiN), metal silicide (e.g., WSi, TiSi, TaSi, or the like), or metal (e.g., W). The doped polysilicon may be, for example, polysilicon containing an N-type impurity (e.g., P, As, or the like) or a P-type impurity (e.g., B or the like).

Each of the stacked structures GS may include one or a plurality of lower gate electrodes G_L and G_B1, a plurality of intermediate gate electrodes G_M disposed on the one or plurality of lower gate electrodes G_L and G_B1, and a plurality of upper gate electrodes G_B2 and G_U disposed on the plurality of intermediate gate electrodes G_M.

In an exemplary embodiment, the one or plurality of lower gate electrodes G_L and G_B1 may be disposed. The plurality of lower gate electrodes G_L and G_B1 may include a lower selection gate electrode G_L, and one or a plurality of lower buffer gate electrodes G_B1 disposed on the lower selection gate electrode G_L. The lower selection gate electrode G_L may be the ground selection line described in FIGS. 1A and 1B (e.g., GSL). In an exemplary embodiment, a lower buffer gate electrode located relatively below the one or plurality of lower buffer gate electrodes G_B1 may also be used as the ground selection line (e.g., GSL in FIGS. 1A and 1B).

In an exemplary embodiment, the plurality of intermediate gate electrodes G_M may be the word lines illustrated in FIGS. 1A and 1B (e.g., WL in FIG. 1A, and WL0 to WLn in FIG. 1B).

In an exemplary embodiment, the one or plurality of upper gate electrodes G_B2 and G_U may be disposed in plural. From among the plurality of upper gate electrodes G_B2 and G_U, an uppermost gate electrode and/or a second-uppermost gate electrode may be an upper selection gate electrode G_U, and one or a plurality of upper gate electrodes positioned between the upper selection gate electrode G_U and the plurality of intermediate gate electrodes G_M may be upper buffer gate electrodes G_B2. The upper selection gate electrode G_U may be the string selection lines described in FIGS. 1A and 1B (e.g., SSL in FIG. 1 and SSL1 to SSL2 in FIG. 2). In an exemplary embodiment, an upper buffer gate electrode from among the upper buffer gate electrodes G_B2 located on a relatively lower portion may be used as the word line described above.

Insulation patterns ISP that separate the upper selection gate electrode G_U in the second direction Y may be included in the semiconductor device 1. The insulation patterns ISP may be disposed at a position higher than the intermediate gate electrodes G_M. The insulation patterns ISP may pass through the upper selection gate electrode G_U, and extend in the first direction X to separate the upper selection gate electrode G_U in the second direction Y, while intersecting the upper selection gate electrode G_U. Similarly, the third secondary separation lines SSc from among the secondary separation lines SS may intersect the upper selection gate electrode G_U, and separate the upper selection gate electrode G_U in the second direction Y. Thus, between two adjacent main separation lines MS, the upper selection gate electrode G_U may be separated in plural by the third secondary separation lines SSc and the insulation patterns ISP in the second direction Y.

A first insulation layer 130 covering the stacked structures GS may be included in the semiconductor device 1. The first insulation layer 130 may have a substantially planar upper surface. A second insulation layer 150 and a third insulation layer 170 that are stacked in sequence on the first insulation layer 130 may be included in the semiconductor device 1. The first to third insulation layers 130, 150 and 170 may be formed of, for example, silicon oxide.

The main separation lines MS and the secondary separation lines SS may pass through the second insulation layer 150, the first insulation layer 130, and the stacked structures GS. The second structure ST2 spaced apart from the stacked structures GS may pass through the second insulation layer 150 and the first insulation layer 130.

The secondary separation lines SS of the first structure ST1 may be spaced apart from one another, and may have end portions facing each other. In this case, the stacked structure GS may be interposed between the secondary separation lines SS having end portions facing each other. The first and second insulation layers 130 and 150 may be interposed between the stacked structure ST2 and the first and second separation lines MS and SS facing the stacked structure ST2.

The memory array region MA and an extension region EA adjacent to the memory array region MA may be disposed on the substrate 103. The extension region EA may be disposed at least on both sides of the memory array region MA. The main separation lines MS may have a shape for intersecting the memory array region MA and the extension region EA. As described above with reference to FIG. 2, the memory array region MA may include a plurality of memory blocks (BLK in FIG. 2) disposed between the main separation lines MS. For example, any one of the memory blocks (BLK in FIG. 2) may be disposed between adjacent main separation lines MS.

Referring primarily to FIG. 6, in the extension region EA, floating dummy gate electrodes G_F disposed on the plurality of intermediate gate electrodes G_M and facing a portion of the upper gate electrodes G_U and G_B2 may be included in the semiconductor device 1. The floating dummy gate electrodes G_F may be formed of the same material as the gate electrodes G_L, G_B1, G_M, G_B2, and G_U. The floating dummy gate electrodes G_F may include pads P disposed in a stepped shape gradually reducing in a direction toward the upper gate electrodes G_U and G_B2.

Referring primarily to FIGS. 4, 6, and 9, the gate electrodes G_L, G_B1, G_M, G_B2, and G_U may have pads P disposed in a stepped shape in the extension region EA. From among the gate electrodes G_L, G_B1, G_M, G_B2, and G_U, portions that are located in the extension region EA and are not overlapped with gate electrodes located in an relatively upper portion may be defined as the pads P.

The pads P of the upper gate electrodes G_U and G_B2 may be disposed in a stepped shape to be lowered to a first step (or height) in a direction from the memory array region MA to the extension region EA.

The pads P of the intermediate gate electrodes G_M may be disposed in the first extension region EA in a stepped shape to be lowered to a second step (or height) greater than the first step as they are disposed in a direction away from the memory array region MA (e.g., in the first direction X). The pads P of the lower gate electrodes G_L and G_B1 may be disposed in the extension region EA in a stepped shape to be lowered to the first step.

In the extension region EA, the pads P of the intermediate gate electrodes G_M may be disposed in a stepped shape to be lowered to the first step as they are disposed in a direction toward one of the main separation lines MS located on either side of the one of the main separation lines MS (this one main separation line MS refers to any one of the main separation lines MS).

The pads of the gate electrodes G_L, G_B1, G_M, G_B2, and G_U described above are not limited to the stepped shapes described above. For example, in exemplary embodiments, the pads of the gate electrodes G_L, G_B1, G_M, G_B2, and G_U may be disposed in various other stepped shapes.

Contact plugs 180 passing through the first to third insulation layers 130, 150 and 170 are disposed on the pads P of the gate electrodes G_L, G_B1, G_M, G_B2, and G_U. The contact plugs 180 may be in contact with the pads P. An outer contact plug 182 spaced apart from the stacked structures GS may be disposed outwardly of (e.g., outside of) the stacked structures GS. For example, an outer contact plug 182 may be disposed adjacent to a nearest stacked structure GS without being a part of the nearest stacked structure GS. For example, as shown in FIG. 4, the outer contact plugs 182 are disposed adjacent to the stacked structure GS.

Referring primarily to FIGS. 4, 6, and 7, memory vertical structures VSm may be disposed on the substrate 103. The memory vertical structures VSm extend in the vertical direction Z substantially perpendicular to the upper surface 103s of the substrate 103. The memory vertical structures VSm may pass through the stacked structures GS located in the memory array region MA. The memory vertical structures VSm may pass through the interlayer insulating layers 106 and the stacked structures GS located in the memory array region MA.

Bit line plugs 175 that pass through the second and third insulation layers 150 and 170 and are electrically connected to the memory vertical structures VSm may be included in the semiconductor device 1. Thus, the memory vertical structures VSm may be electrically connected to the bit lines described in FIGS. 1A and 1B (e.g., BL in FIG. 1A and BL1 to BL2 in FIG. 1B) through the bit line plugs 175.

In an exemplary embodiment, dummy vertical structures VSd that may pass through the stacked structures GS and are formed with the same or similar structure as the memory vertical structures VSm may be disposed on the substrate 103.

In an exemplary embodiment, external vertical structures VSe that may be disposed on the substrate 103, spaced apart from the stacked structures GS, and formed of the same or a similar structure as the memory vertical structures VSm, may be disposed in the semiconductor device 1.

Referring primarily to FIG. 10, each of the memory vertical structures VSm may include a channel semiconductor layer 140 extending in the vertical direction, and a gate dielectric structure 128 disposed between the channel semiconductor layer 140 and stacked structures GS.

Each of the memory vertical structures VSm may further include a semiconductor pattern 122, a vertical core pattern 132 disposed on the semiconductor pattern 122, and a pad pattern 134 disposed on the vertical core pattern 132.

The channel semiconductor layer 140 may be disposed such that it contacts the semiconductor pattern 122 and surrounds an outer surface of the vertical core pattern 132. The gate dielectric structure 128 may be disposed such that it surrounds an outer surface of the channel semiconductor layer 140. The semiconductor pattern 122 may be, for example, an epitaxial material layer that may be formed by a selective epitaxial growth (SEG) process. The vertical core pattern 132 may be formed of, for example, an insulating material (e.g., silicon oxide or the like). The pad pattern 134 may be formed of, for example, polysilicon having N-type conductivity, and may be a drain region. The pad pattern 134 may be disposed on a level higher than the gate structures GS. The pad patterns 134 of the memory vertical structures VSm may be electrically connected to the bit line plugs 175 described above.

The channel semiconductor layer 140 may extend in a direction substantially perpendicular to a surface of the substrate 103, and may pass through the intermediate gate electrodes G_M and the upper gate electrode G_U of the stacked structure GS. The channel semiconductor layer 140 may be formed of, for example, a polysilicon layer. The semiconductor pattern 122 may pass through the lower gate electrode G_L. The semiconductor pattern 122 may be referred to as a lower channel semiconductor layer.

The gate dielectric structure 128 may include a tunnel dielectric 126, a data storage layer 125, and a blocking dielectric 124. The data storage layer 125 may be disposed between the tunnel dielectric 126 and the blocking dielectric 124. The blocking dielectric 124 may be disposed between the data storage layer 125 and the stacked structure GS. The tunnel dielectric 126 may be disposed between the data storage layer 125 and the channel semiconductor layer 140. The tunnel dielectric 126 may include, for example, silicon oxide and/or impurity doped silicon oxide. The blocking dielectric 124 may include, for example, silicon oxide and/or a high dielectric. The data storage layer 125 may be formed of a material capable of storing information such as, for example, silicon nitride.

The data storage layer 125 may include data storage regions 125d capable of storing data between the channel semiconductor layer 140 and the intermediate gate electrodes G_M, which may be word lines. For example, according to operating conditions of a non-volatile memory device such as a flash memory device, electrons injected into the data storage regions 125d from the channel semiconductor layer 140 through the tunnel dielectric 126 may be trapped and retained, or electrons trapped in the data storage regions 125d of the data storage layer 125 may be erased. Thus, the memory cells described above in FIG. 1B (e.g., MCT in FIG. 1B) may include the data storage regions 125d.

An additional gate dielectric 155 disposed between the gate electrodes G_L, G_B1, G_M, G_B2, and G_U and the memory vertical structures VSm, and extending onto each of upper and lower portion surfaces of the gate electrodes G_L, G_B1, G_M, G_B2, and G_U, may be included in the semiconductor device 1. The additional gate dielectric 155 may be formed of, for example, a high dielectric such as aluminum oxide or the like.

The present inventive concept is not limited to the above-described exemplary embodiments, but may be variously modified. Hereinafter, various exemplary embodiments or various modified examples of semiconductor devices according to exemplary embodiments of the present inventive concept will be described with reference to FIGS. 11 to 16.

Figure 11:
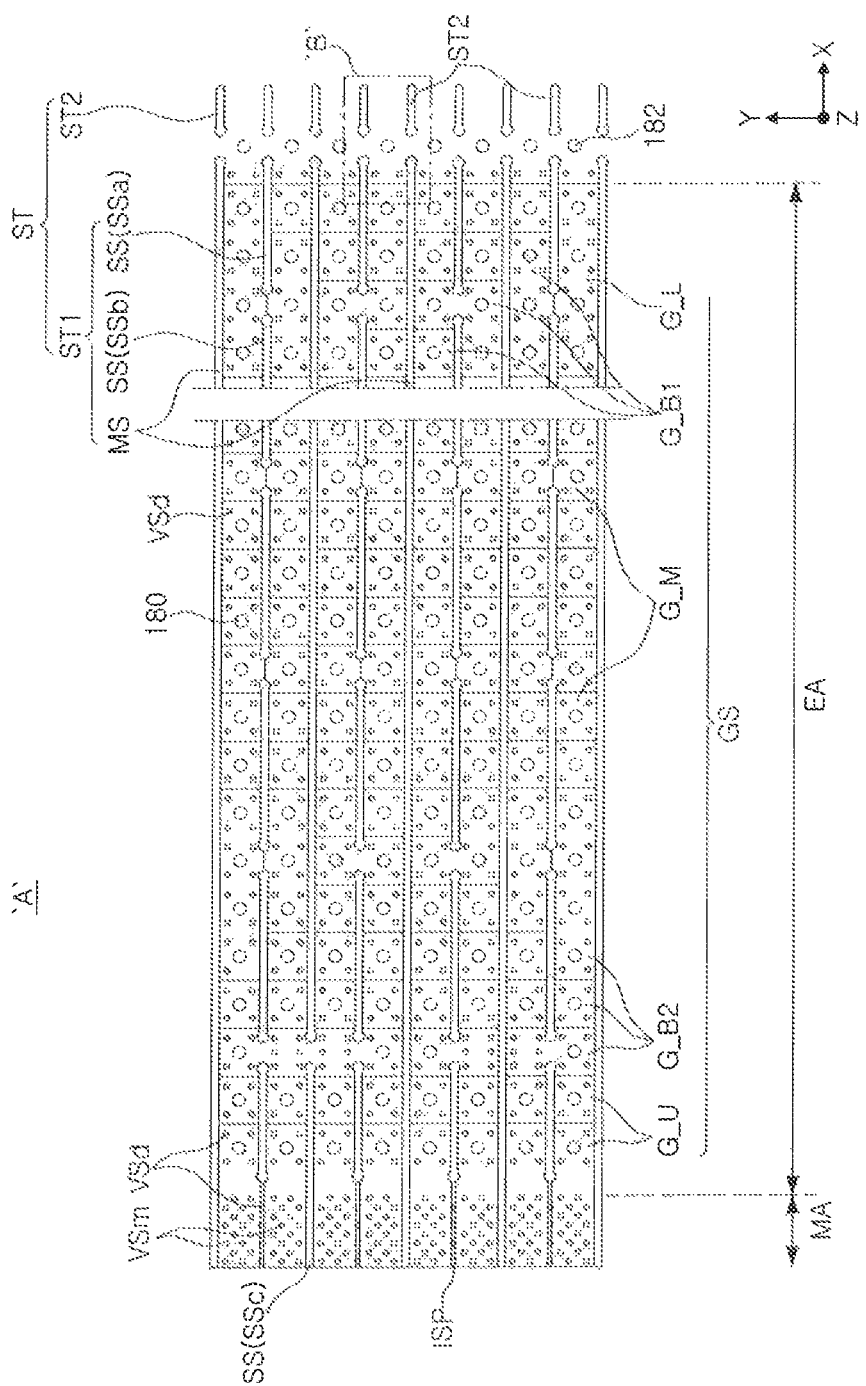
FIG. 11 is a partially enlarged plan view illustrating region 'A' in FIG. 3A according to an exemplary embodiment of the present inventive concept.
Figure 12A:
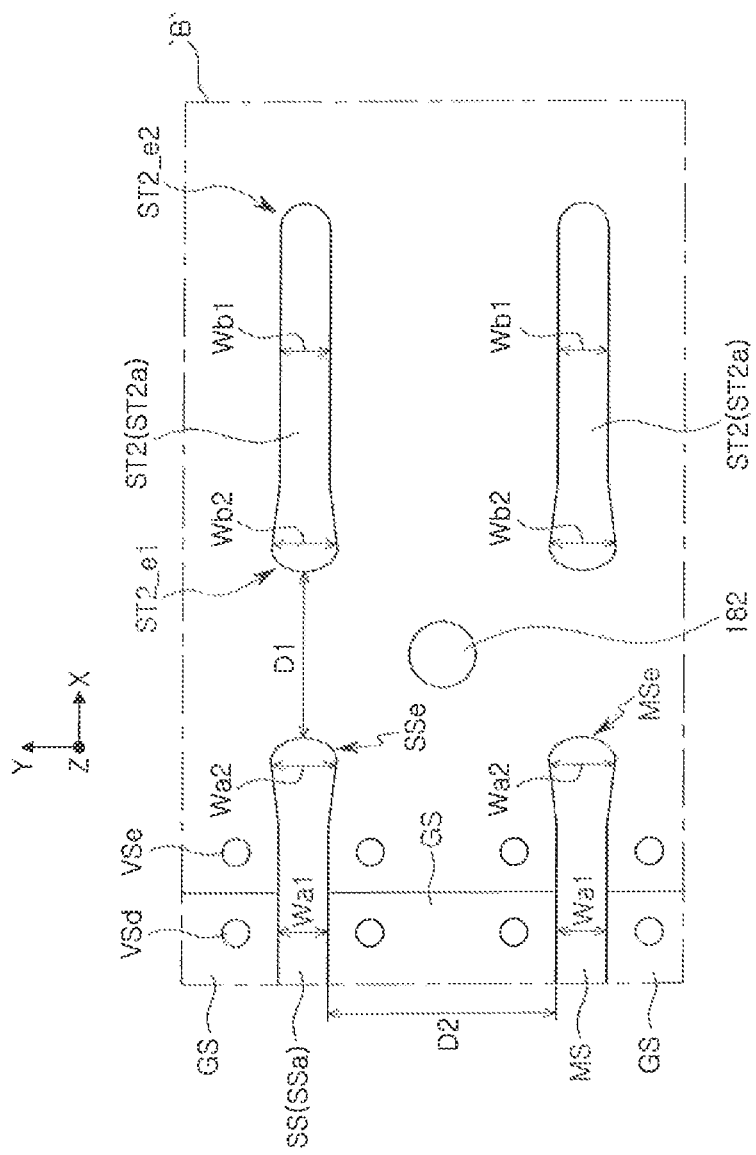
FIG. 12A is a partially enlarged plan view illustrating region 'B' in FIG. 11 according to an exemplary embodiment of the present inventive concept.
Figure 12B:
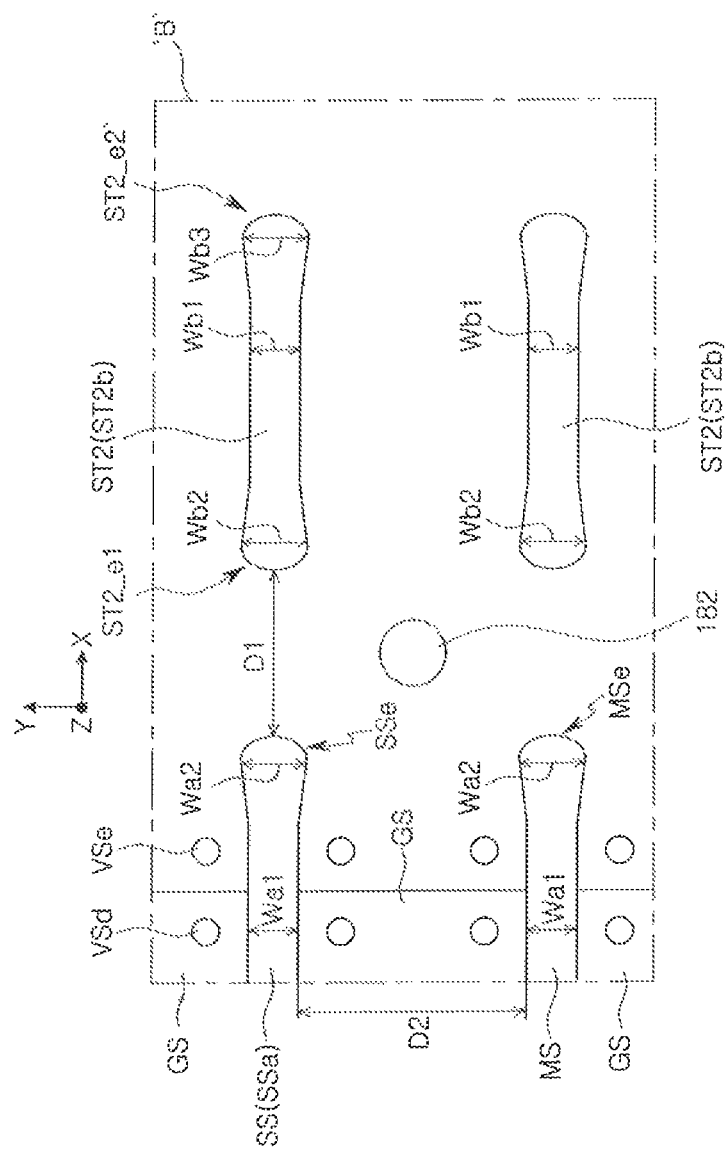
FIG. 12B is a partially enlarged plan view illustrating region 'B' in FIG. 11 according to an exemplary embodiment of the present inventive concept.
Figure 13:
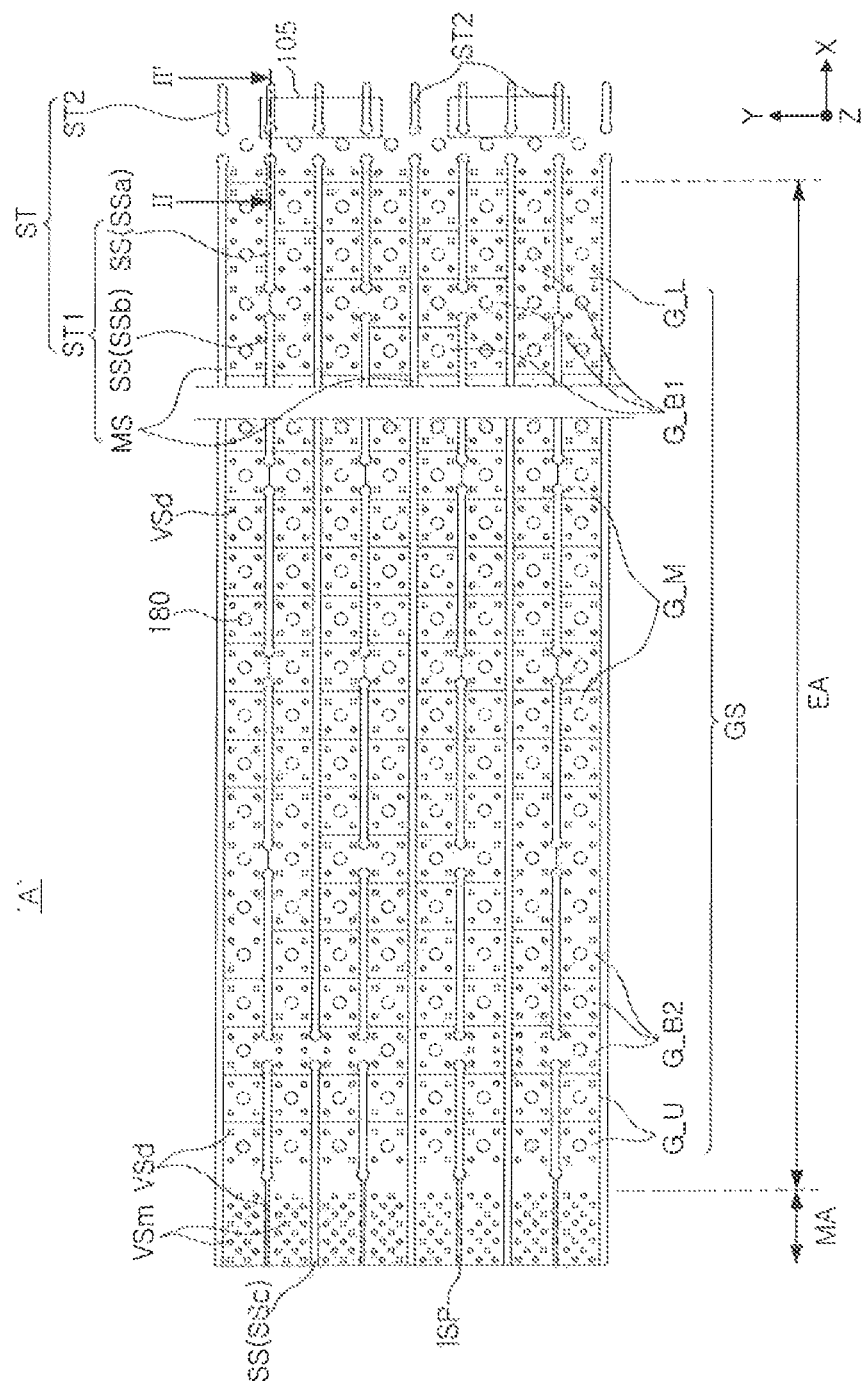
FIG. 13 is a partially enlarged plan view illustrating region 'A' in FIG. 3A according to an exemplary embodiment of the present inventive concept.
Figure 14:
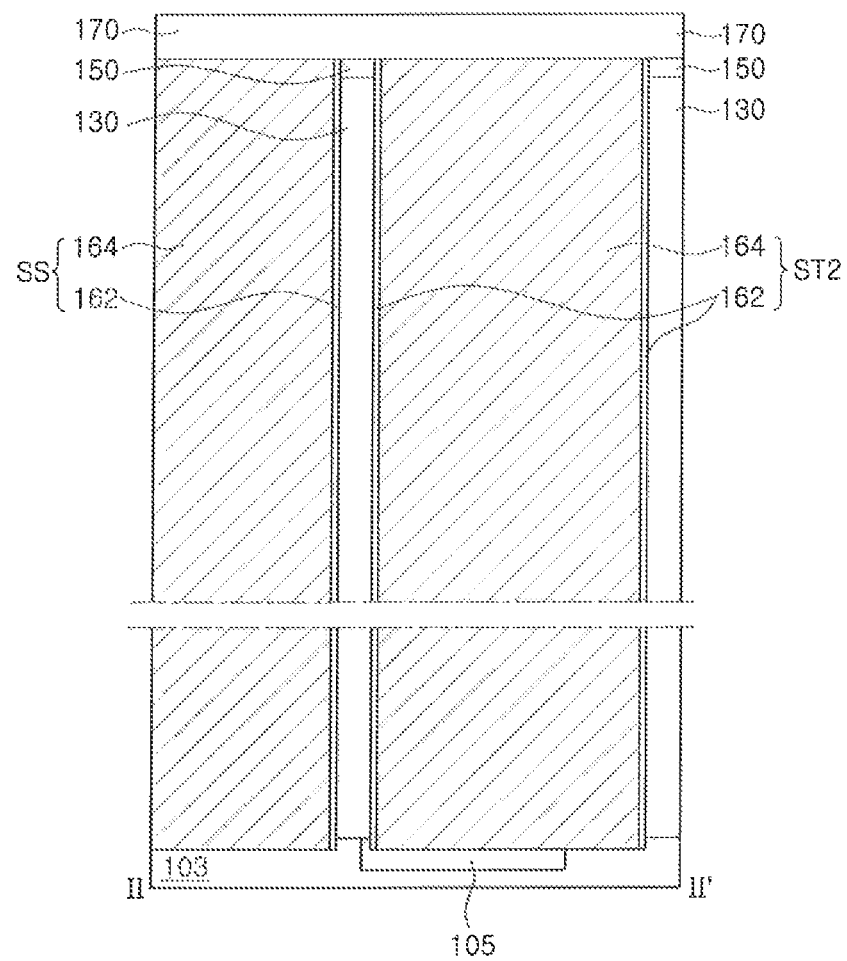
FIG. 14 is a cross-sectional view taken along line II-IF in FIG. 13 according to an exemplary embodiment of the present inventive concept.
Figure 15:
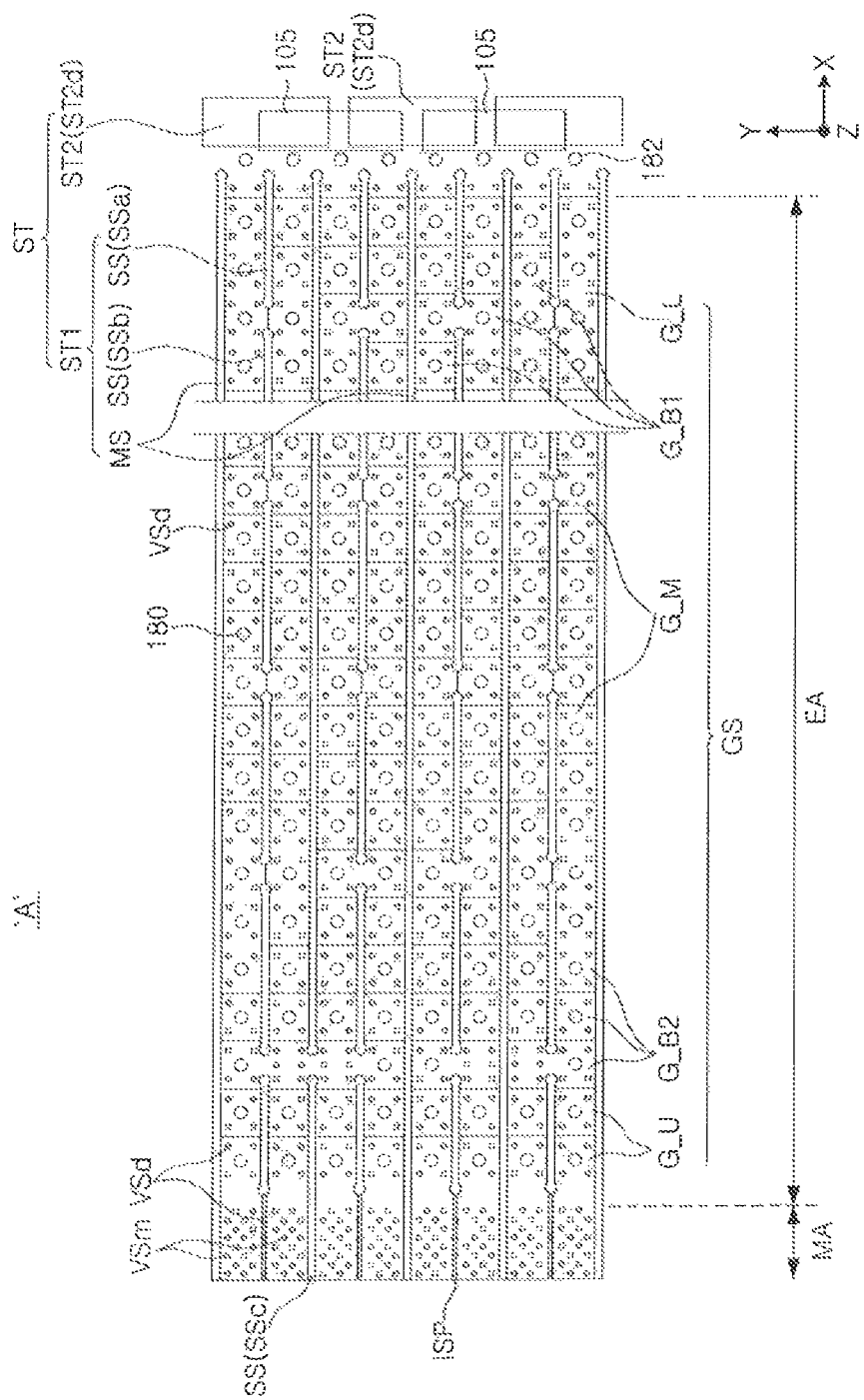
FIG. 15 is a partially enlarged plan view illustrating region 'A' in FIG. 3A according to an exemplary embodiment of the present inventive concept.
Figure 16:
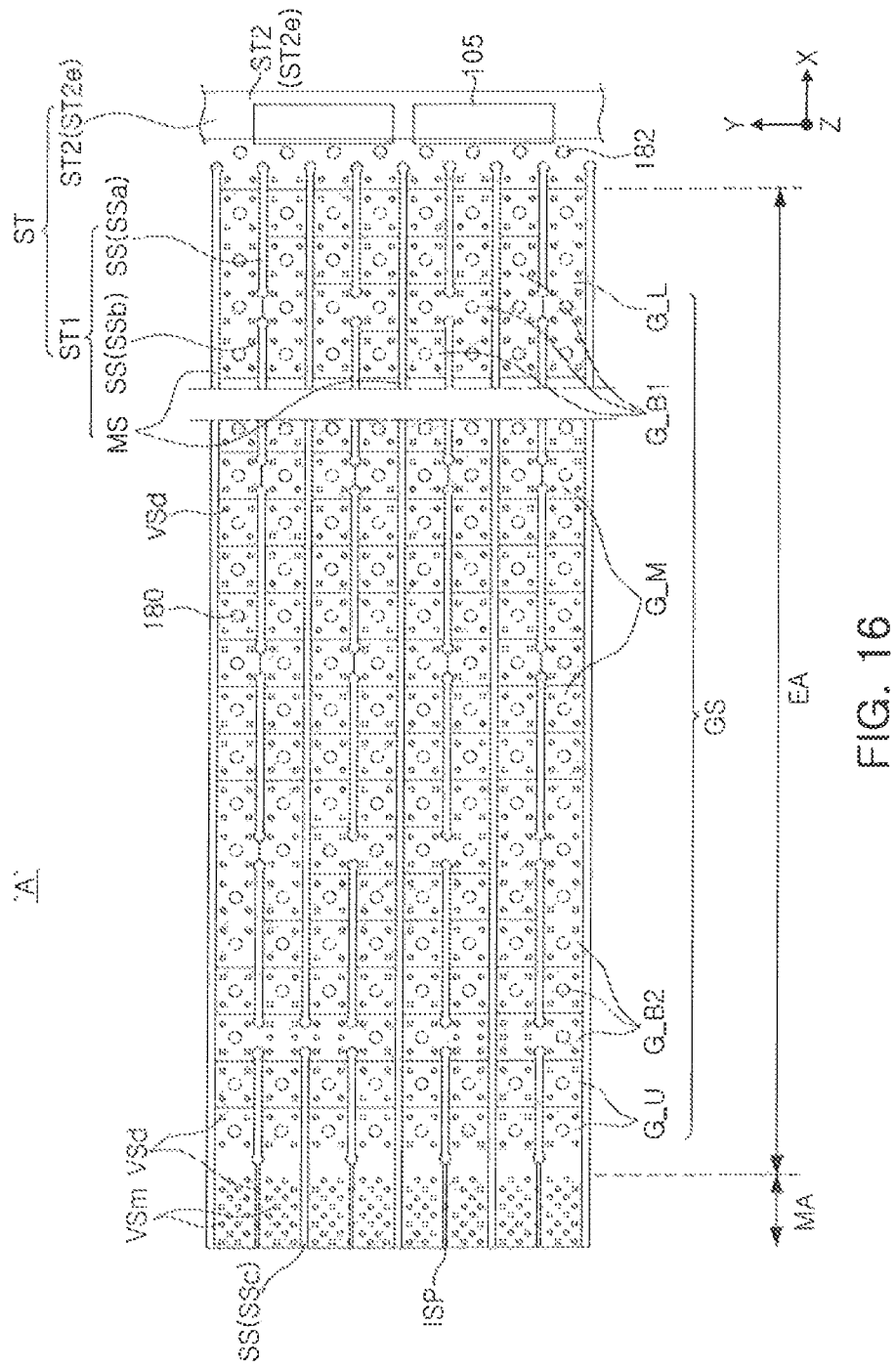
FIG. 16 is a partially enlarged plan view illustrating region 'A' in FIG. 3 according to an exemplary embodiment of the present inventive concept.

FIG. 11 is a partially enlarged plan view illustrating region 'A' in FIG. 3A according to an exemplary embodiment of the present inventive concept, which shows an example of shapes of a first structure ST1 and a second structure ST2. Each of FIGS. 12A, 12B and 12C is a partially enlarged plan view illustrating region 'B' in FIG. 11 according to an exemplary embodiment of the present inventive concept. FIG. 13 is a partially enlarged plan view illustrating region 'A' in FIG. 3A according to an exemplary embodiment of the present inventive concept. FIG. 14 is a cross-sectional view taken along line II-II' in FIG. 13 according to an exemplary embodiment of the present inventive concept. FIG. 15 is a partially enlarged plan view illustrating region 'A' in FIG. 3A according to an exemplary embodiment of the present inventive concept. FIG. 16 is a partially enlarged plan view illustrating region 'A' in FIG. 3 according to an exemplary embodiment of the present inventive concept.

For convenience of description, in describing various exemplary embodiments or various modified examples below, a further description of components previously described may be omitted, and the description may primarily focus on newly introduced and modified components.

First, examples of shapes of a first structure ST1 and a second structure ST2 will be described with reference to FIGS. 11 and 12A. FIG. 11 illustrates an example of shapes of a first structure ST1 and a second structure ST2.

Referring to FIGS. 11 and 12A, as described above, the first structure ST1 may include the main separation lines MS and the secondary separation lines SS. The main separation lines MS and the secondary separation lines SS may have substantially the same width in the second direction Y. Each of the secondary separation lines SS may have a length in the first direction X shorter than each of the main separation lines MS.

In an exemplary embodiment, the main separation lines MS may extend in the first direction X, and may include a linear portion having a first width Wa1, and end portions MSe extending from the linear portion, located on both sides of the linear portion, and having a second width Wa2 that is greater than the first width Wa1.

In an exemplary embodiment, each of the secondary separation lines SS may extend in the first direction X, and may include a linear portion having a first width Wa1, and end portions SSe extending from the linear portion, located on both sides of the linear portion, and having a second width Wa2 that is greater than the first width Wa1.

The main separation lines MS and the first secondary separation lines SSa may extend the same length in an outer direction of the stacked structures GS. The main separation lines MS may extend in an outer direction of the stacked structures GS such that the main separation lines MS include end portions MSe located on outer sides of the stacked structures GS. The first secondary separation lines SSa of the secondary separation lines SS may extend in an outer direction of the stacked structures GS such that the first secondary separation lines SSa have end portions SSe located on outer sides of the stacked structures GS.

The end portions SSe of the first secondary separation lines SSa and the end portions MSe of the main separation lines MS may have substantially the same size. For example, each of the first secondary separation lines SSa and the main separation lines MS may include a separation linear portion, and edge end portions SSe and MSe extending from the separation linear portion. The edge end portions SSe and MSe may be located outwardly of (e.g., outside of) the stacked structure GS. For example, the edge end portions SSe and MSe may be disposed adjacent to the nearest stacked structure GS and may not be a part of the nearest stacked structure GS. The width Wa2 of the edge end portions SSe and MSe in the second direction Y may be greater than the width Wa1 of the separation linear portion in the second direction Y.

In an exemplary embodiment, the second structure ST2 may be located on outer sides of the stacked structures GS, and may have bar-shaped bar patterns ST2a corresponding respectively to the first secondary separation lines SSa and the main separation lines MS.

Each of the bar patterns ST2a of the second structure ST2 may have an outer linear portion, and a first outer side end portion ST2_e1 and a second outer side end portion ST2_e2 extending from the outer linear portion and located on both sides of the outer linear portion.

The first outer side end portions ST2_e1 of the bar patterns ST2a of the second structure ST2 may have a width Wb2 in the second direction Y that is greater than a width Wb1 of the outer linear portions of the bar patterns ST2a of the second structure ST2 in the second direction Y. The first outer side end portions ST2_e1 of the bar patterns ST2a of the second structure ST2 may have a width in the second direction Y that is different from those of the second outer side end portions ST2_e2 of the bar patterns ST2a of the second structure ST2. The first outer side end portions ST2_e1 of the bar patterns ST2a of the second structure ST2 may have a width that is greater than those of the second outer side end portions ST2_e2 of the bar patterns ST2a of the second structure ST2.

The first outer side end portions ST2_e1 of the bar patterns ST2a of the second structure ST2 may face the edge end portions SSe and MSe of the first secondary separation lines SSa and the main separation lines MS, which are located on outer sides of the stacked structures GS.

A distance D2 spaced apart in the second direction Y between the separation lines SSa and MS including the first secondary separation lines SSa and the main separation lines MS located on outer sides of the stacked structures GS, may be greater than a distance D1 spaced apart in the first direction X between the first outer side end portions ST2_e1 of the bar patterns ST2a of the second structure ST2 facing each other, and the edge end portions SSe and MSe of the first secondary separation lines SSa and the main separation lines MS, which are located on the outer sides of the stacked structures GS. That is, a distance D2 spaced apart in the second direction Y between the separation lines SSa and MS may be greater than a distance D1 spaced apart in the first direction X between the first structure ST1 and the second structure ST2.

In a modified example, referring to FIG. 12B, bar patterns (e.g., ST2a in FIG. 12A) of a second structure ST2 may be modified into bar patterns ST2b including second outer side end portions ST2_e2' having a width Wb3 in a second Y direction, which is greater than a width Wb1 in a second direction Y of outer linear portions. Therefore, the modified bar patterns ST2b may include an outer linear portion, and the first and second outer side end portions ST2_e1 and ST2_e2' disposed on both sides of the outer linear portion and having a width greater than those of the outer linear portion.

In a modified example, referring to FIG. 12C, bar patterns (e.g., ST2a in FIG. 12A) of a second structure ST2 may be modified into bar patterns ST2c having a width Wb1' greater than a width Wa2 of end portions SSe and MSe of first secondary separation lines SSa and main separation lines MS, located on outer sides of stacked structures GS.

In a modified example, referring to FIGS. 13 and 14, a semiconductor device according to an exemplary embodiment may further include an isolation pattern 105 overlapping at least a portion of the second structure ST2. The isolation pattern 105 may be formed of an insulating material such as, for example, silicon oxide, silicon nitride, or the like. The isolation pattern 105 may be disposed on the substrate 103. The isolation pattern 105 may have an elongated bar shape in a second direction Y. At least a portion of the second structure ST2 may be disposed on the isolation pattern 105. The first structure ST1 including main separation lines MS and secondary separation lines SS may be spaced apart from the isolation pattern 105. In an exemplary embodiment, the first structure ST1 does not overlap the isolation pattern 105. The isolation pattern 105 may be disposed outwardly of (e.g., outside of) the stacked structure GS and disposed in the substrate 103. For example, the isolation pattern 105 may be disposed adjacent to the stacked structure GS without being a part of the stacked structure GS.

In a modified example, referring to FIG. 15, bar patterns (e.g., ST2a in FIG. 12A) having an elongated bar shape in the first direction X, as described above, may be modified into bar-shaped bar patterns ST2d elongated in the second direction Y.

In a modified example, referring to FIG. 16, a second structure ST2 may be transformed into linear-shaped line patterns ST2e extending in the second direction Y.

Next, a method of forming a semiconductor device according to an exemplary embodiment of the present inventive concept will be described with reference to FIGS. 17, 18A to 18C, 19A to 19C, and 20A to 20C.

Figure 17:
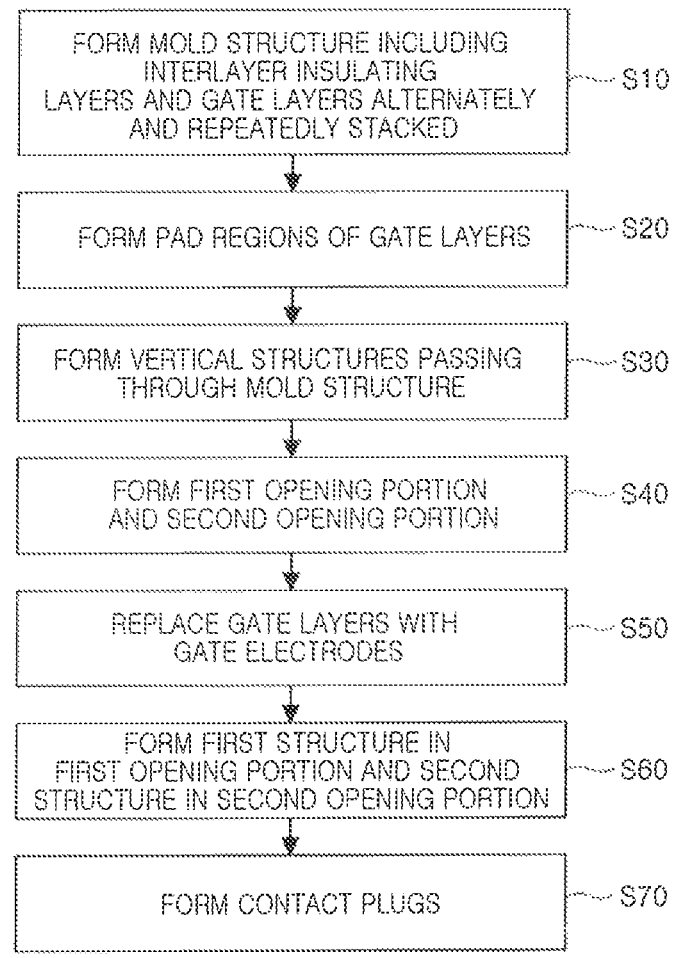
FIG. 17 is a flow chart illustrating a method of forming a semiconductor device according to an exemplary embodiment of the present inventive concept.
Figure 18B:
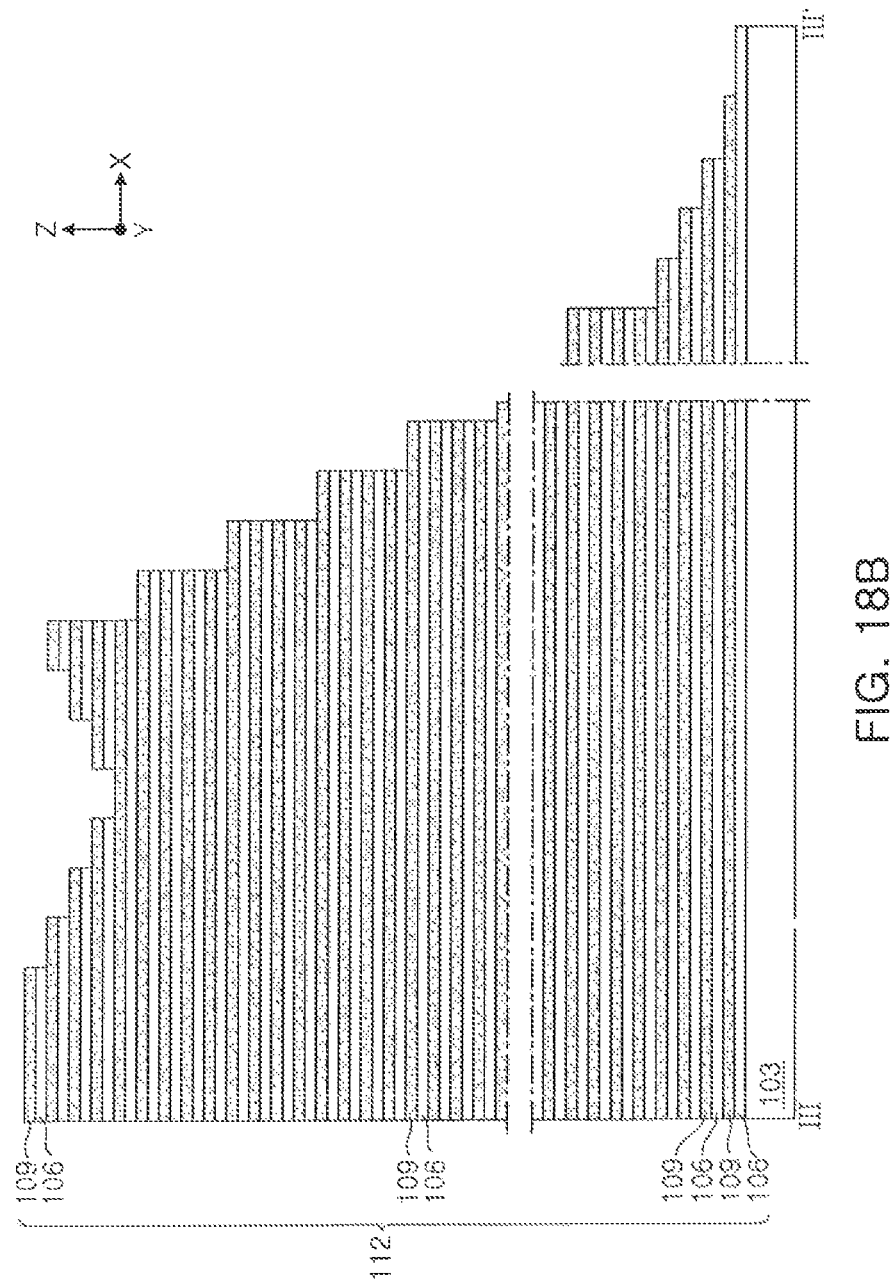
FIGS. 18B, 19B, and 20B are cross-sectional views taken along line III-III' in FIG. 4 according to an exemplary embodiment of the present inventive concept.
Figure 19A:
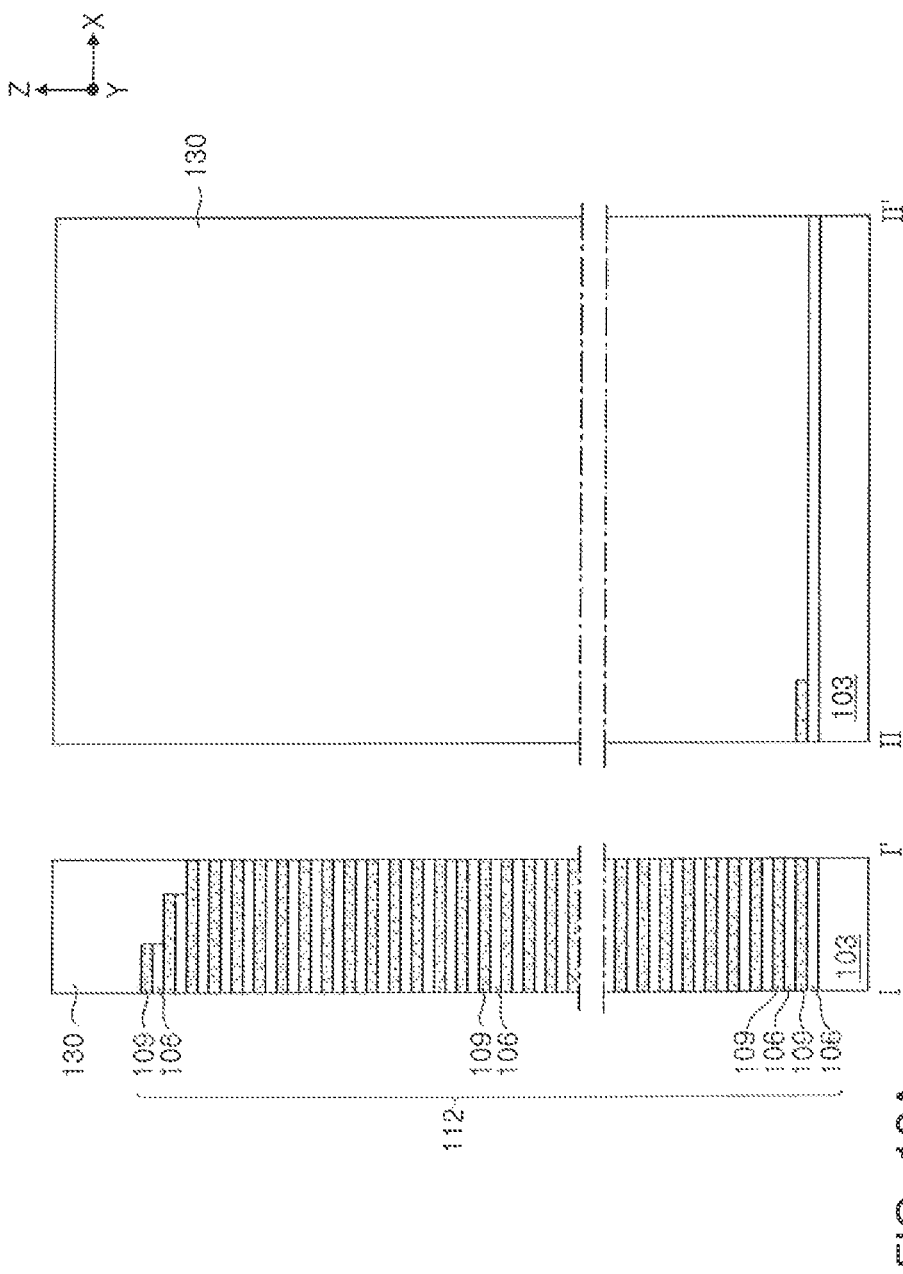
Figure 19B:
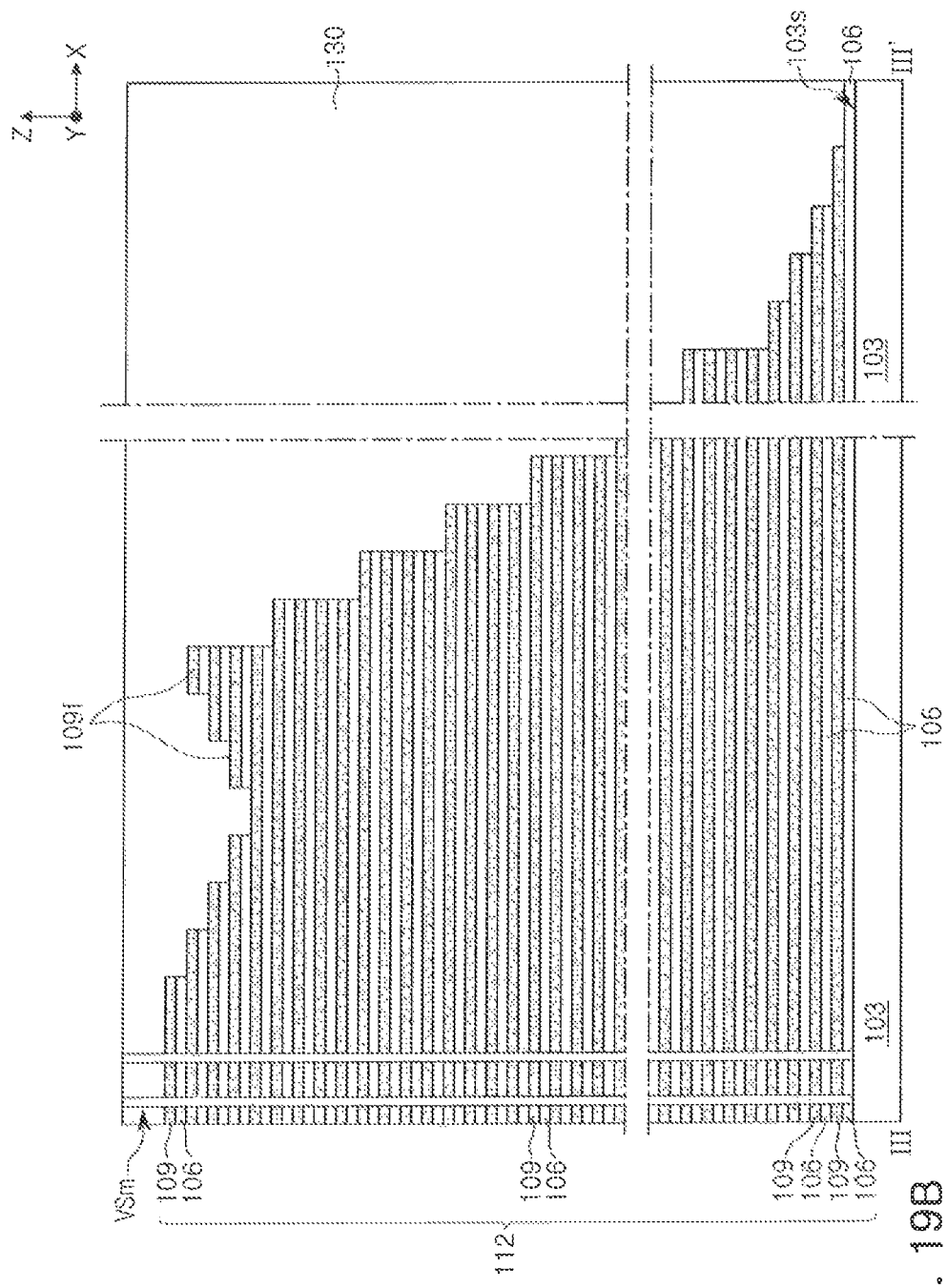
Figure 19C:
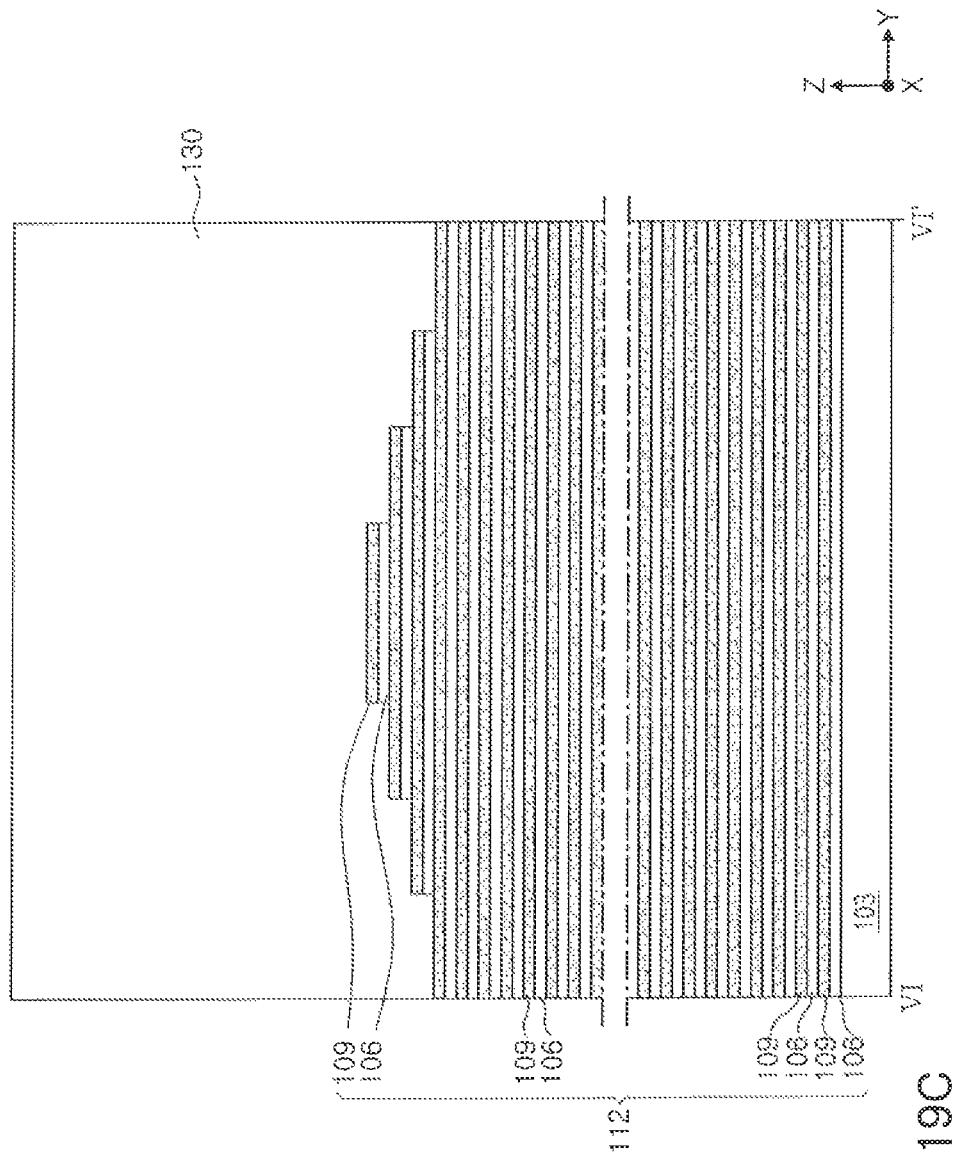
Figure 20A:
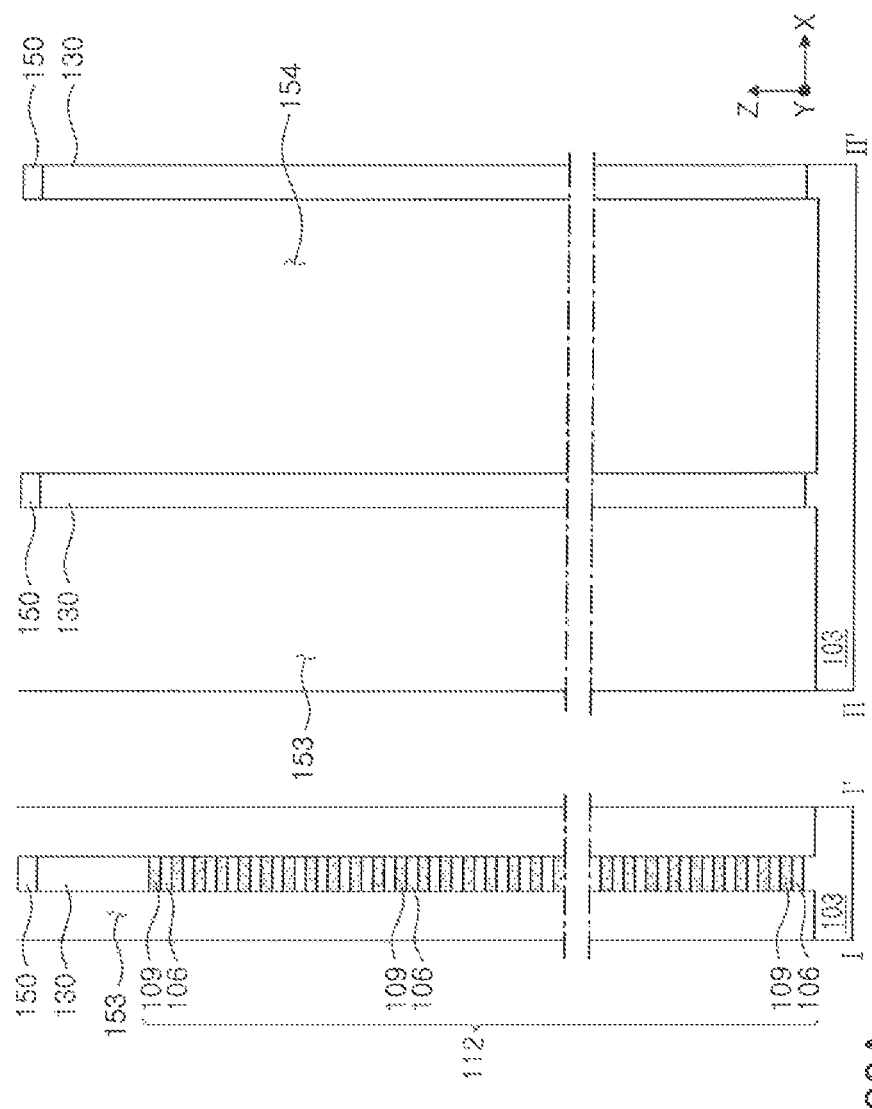
Figure 20B:
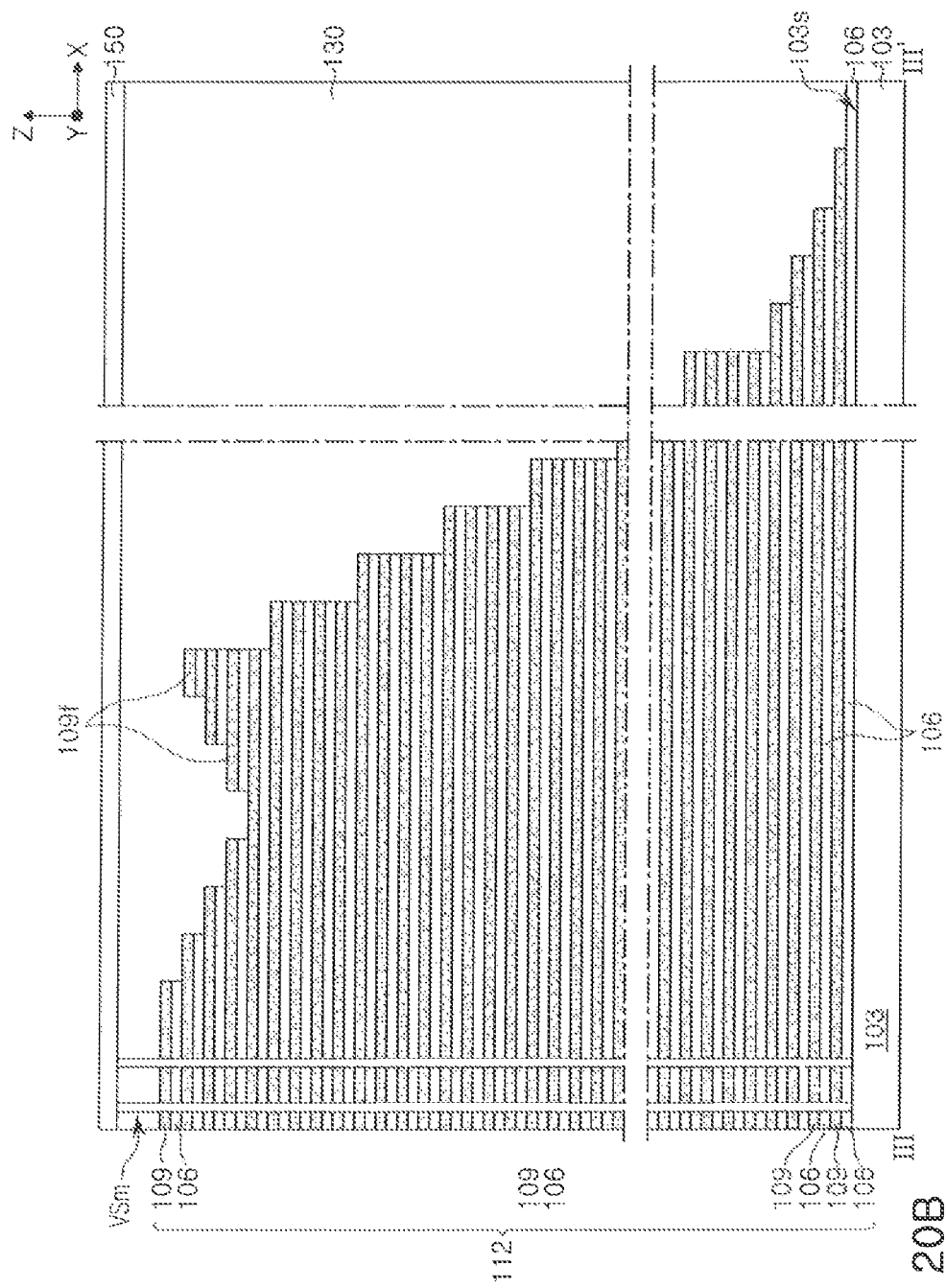
Figure 20C:
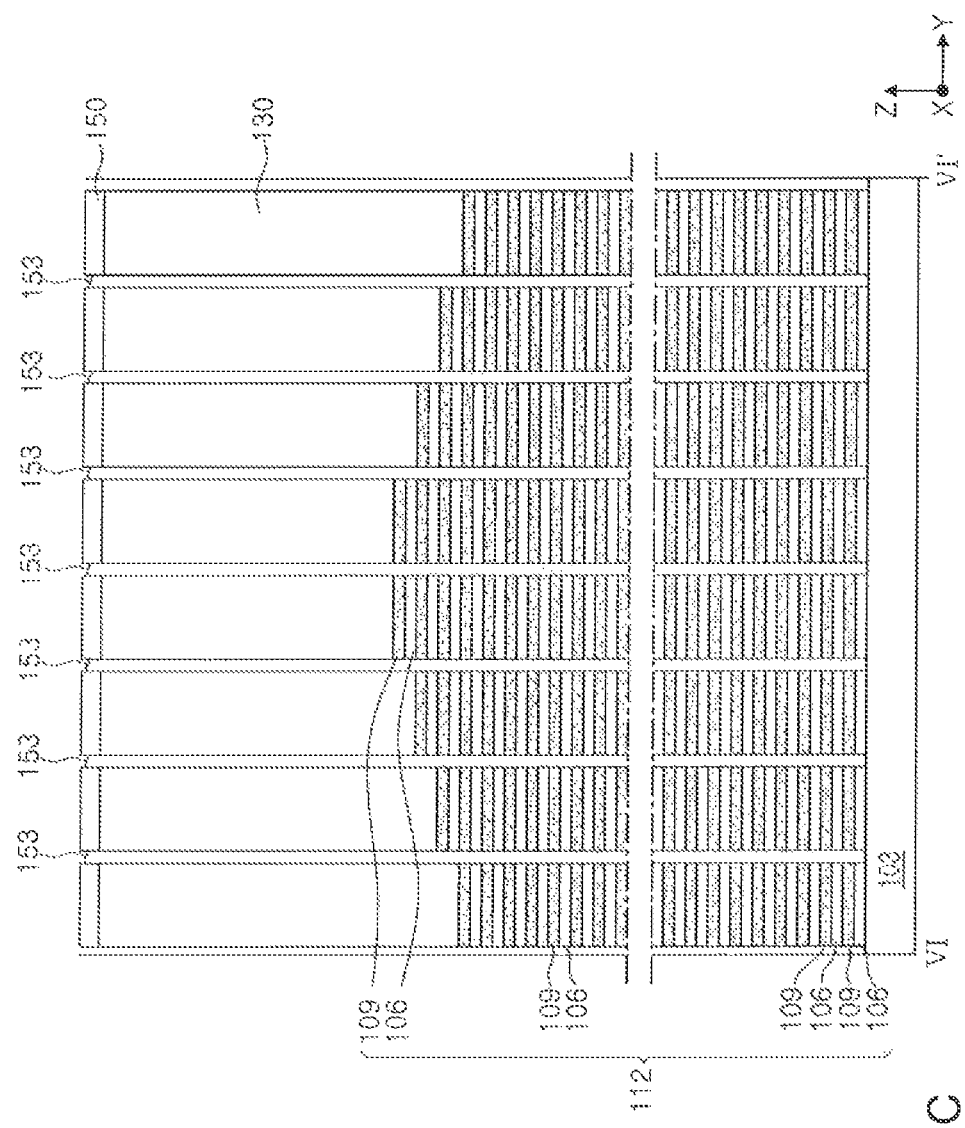

FIG. 17 is a flow chart illustrating a method of forming a semiconductor device according to an exemplary embodiment of the present inventive concept. FIGS. 18A, 19A, and 20A are cross-sectional views taken along lines I-I' and II-II' in FIG. 4 according to an exemplary embodiment of the present inventive concept. FIGS. 18B, 19B, and 20B are cross-sectional views taken along line III-III' in FIG. 4 according to an exemplary embodiment of the present inventive concept. FIGS. 18C, 19C, and 20C are cross-sectional views taken along line VI-VI' in FIG. 4 according to an exemplary embodiment of the present inventive concept.

Referring to FIGS. 4, 17, 18A, 18B, and 18C, a mold structure 112 including interlayer insulating layers 106 and gate layers 109 alternately and repeatedly stacked on a substrate 103 may be formed (S10). The interlayer insulating layers 106 may be formed of, for example, silicon oxide, and the gate layers 109 may be formed of, for example, silicon nitride.

Pad regions 109f of the gate layers 109 may be formed (S20). The forming of the pad regions may include patterning the gate layers 109 using photographic and etching processes to form step-shaped pad regions. The step-shape may be formed in various shapes, and is not limited to the shapes illustrated in the drawings.

Referring to FIGS. 4, 17, 19A, 19B, and 19C, the first insulation layer 130 planarized on the mold structure 112 may be formed. Vertical structures passing through the mold structure 112 may be formed (S30). The vertical structures may be the memory vertical structures VSm, the dummy vertical structures VSd, and the outer vertical structures VSe described with reference to FIGS. 4 to 10. The memory vertical structures VSm, the dummy vertical structures VSd, and the outer vertical structures VSe may be the same as the memory vertical structures VSm described with reference to FIG. 10. For example, forming the vertical structures may include forming channel holes passing through the first insulation layer 130 and the mold structures 112, and filling the vertical structures VSm, VSd, and VSe into the channel holes.

Referring to FIGS. 4, 17, 20A, 20B, and 20C, the second insulation layer 150 may be formed on the first insulation layer 130. A first opening portion 153 and a second opening portion 154 may be formed (S40). The first opening portion 153 and the second opening portion 154 may be formed by patterning the first insulation layer 130, the second insulation layer 150, and the mold structure 112 to expose the substrate 103. A planar shape of the first opening portion 153 may be the same as a planar shape of the first structure ST1 including the main separation lines MS and the secondary separation lines SS, as described with reference to FIGS. 3 to 10. A planar shape of the second opening portion 154 may be the same as a planar shape of the second structure ST2, as described with reference to FIGS. 3 to 10.

Referring again to FIGS. 3 to 10, the gate layers 109 may be replaced with the gate electrodes G_L, G_B1, G_M, G_B2, and G_U (S50). The replacement of the gate layers 109 with the gate electrodes G_L, G_B1, G_M, G_B2, and G_U may include removing the gate layers 109 exposed by the first opening portion 153 to form empty spaces, and forming the gate electrodes G_L, G_B1, G_M, G_B2, and G_U in the empty spaces. For example, after the gate layers 109 exposed by the first opening portion 153 are removed to form the void spaces, a metal material such as, for example, tungsten may be deposited on the gate electrodes G_L, G_B1, G_M, G_B2, and G_U in the empty spaces, and the metal material remaining in the first opening portion 153 may be removed.

Next, the above-described first and second structures ST1 and ST2 filling the first and second opening portions 153 and 154 may be formed (S60). The third insulation layer 170 may be formed on the second insulation layer 150.

Bit line plugs 175 passing through the second and third insulation layers 150 and 170 and electrically connected to the memory vertical structures VSm may be formed. Contact plugs 180 may be formed (S70). The contact plugs 180 may pass through the first to third insulation layers 130, 150 and 170, and be electrically connected to the gate electrodes G_L, G_B1, G_M, G_B2, and G_U. Outer contact plugs 182 spaced apart from the gate electrodes G_L, G_B1, G_M, G_B2, and G_U, as well as from the contact plugs 180, may be formed.

As described above, after removing the gate layers 109 exposed by the first opening portions 153 to form the empty spaces, a metal material such as, for example, tungsten or the like, may be deposited to form the gate electrodes G_B1, G_M, G_B2, and G_U, and the metal materials remaining in the first opening portions 153 may be removed.

In exemplary embodiments, the planar shape of the end portion of the first opening portion 153 located on outer sides of the mold structure 112 is not excessively narrowed by the second opening portion 154. For example, during the process of etching the mold structure 112 by an etching process to form the first and second opening portions 153 and 154, etching gas may be continuously supplied to the second opening portion 154 to form the second opening portions 154. Therefore, etching gas may be appropriately supplied to the end portion of the first opening portion 153 located on outer sides of the mold structure 112.

For example, the second opening portion 154 is located at the outermost one of the first and second opening portions 153 and 154. Therefore, although amounts of the etching gas to be supplied into the second opening portion 154 are reduced by etching loading effects, as the etching process proceeds, amounts of the etching gas supplied into the first opening portion 153 located on relatively inner sides may not decrease. Therefore, the first opening portion 153, which may directly or indirectly affect the electrical characteristics of the semiconductor device, may be formed without defects. Therefore, since the second opening portion 154 allows a sufficient planar area of the first opening portion 153 to be secured, the metal material such as, for example, tungsten, remaining in the first opening portion 153 may be removed without defects. Therefore, productivity of a semiconductor device including the first and second structures ST1 and ST2 formed in the first and second opening portions 153 and 154 may be improved, and reliability of a semiconductor device may be improved. Further, even when the number of the gate layers 109 of the mold structure 112 is increased, the semiconductor device may be formed without defects. Therefore, the number of the gate electrodes may be increased, and the degree of integration of a semiconductor device may be improved according to exemplary embodiments of the present inventive concept.

According to exemplary embodiments of the present inventive concept, a semiconductor device that improves the yield and productivity, and that further improves the degree of integration and reliability, is provided.

In an exemplary embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an exemplary embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:
1. A semiconductor device, comprising:
   a memory array region disposed on a substrate, and an extension region disposed adjacent to the memory array region;
   a stacked structure disposed on the substrate, wherein the stacked structure comprises a plurality of gate electrodes in the memory array region and the extension region, wherein the plurality of gate electrodes comprise a plurality of pads disposed in a stepped shape in the extension region;

a first structure disposed on the substrate in the memory array region and the extension region, wherein the first structure passes through the stacked structure in a first direction substantially perpendicular to an upper surface of the substrate; and a second structure disposed on the substrate, wherein the second structure is disposed outside of the stacked structure, faces the first structure, and is spaced apart from the first structure, wherein the plurality of gate electrodes are stacked in the first direction and extend in a second direction substantially perpendicular to the first direction, wherein the first structure comprises a plurality of separation lines passing through at least a portion of the plurality of gate electrodes in the first direction and extending outside of the stacked structure in the second direction, wherein the plurality of separation lines of the first structure extend in the second direction and comprise end portions located on an outer side of the stacked structure and facing the second structure, wherein the first structure and the second structure are formed of a same material, and wherein the plurality of gate electrodes of the stacked structure are not disposed between the first structure and the second structure.

2. The semiconductor device according to claim 1, wherein each of the first and second structures comprises a separation core pattern, and insulating spacers surrounding side surfaces of the separation core pattern.

3. The semiconductor device according to claim 2, wherein the separation core pattern is formed of a conductive material and contacts the substrate.

4. The semiconductor device according to claim 1, wherein upper surfaces of the first and second structures are coplanar with each other.

5. The semiconductor device according to claim 4, wherein the first and second structures extend into the substrate.

6. The semiconductor device according to claim 1, wherein
the separation lines of the first structure have a linear shape extending in the second direction.

7. The semiconductor device according to claim 6, wherein the second structure comprises bar patterns extending in the second direction, and the bar patterns correspond one-to-one with the separation lines of the first structure.

8. The semiconductor device according to claim 7, wherein
each of the separation lines of the first structure comprises a separation linear portion extending in the second direction and an edge end portion extending from the separation linear portion,
a width of the edge end portion in a third direction is greater than a width of the separation linear portion in the third direction, and
the third direction is substantially parallel to the upper surface of the substrate and substantially perpendicular to the second direction.

9. The semiconductor device according to claim 8, wherein
each of the bar patterns of the second structure comprises an outer linear portion, and a first outer side end portion and a second outer side end portion extending from the outer linear portion and located on both sides of the outer linear portion,
the first outer side end portion faces the edge end portion, and
a width of the first outer side end portion in the third direction is greater than a width of the outer linear portion in the third direction.

10. The semiconductor device according to claim 9, wherein a width of the second outer side end portion in the third direction is different from the width of the first outer side end portion in the third direction.

11. The semiconductor device according to claim 7, wherein a width of each of the bar patterns is greater than a width of each of the separation lines.

12. The semiconductor device according to claim 6, wherein the second structure is bar-shaped having bar patterns extending in a third direction, or line-shaped having line patterns extending in the third direction, and the third direction is substantially parallel to the upper surface of the substrate and substantially perpendicular to the second direction.

13. The semiconductor device according to claim 1, wherein
a distance between the separation lines in a third direction is greater than a distance between the first structure and the second structure in the second direction,
and
the third direction is substantially parallel to the upper surface of the substrate and substantially perpendicular to the second direction.

14. The semiconductor device according to claim 1, further comprising:
a channel semiconductor layer extending in the first direction and passing through the plurality of gate electrodes in the memory array region; and
a plurality of data storage regions disposed between the channel semiconductor layer and the plurality of gate electrodes in the memory array region.

15. A semiconductor device, comprising:
a stacked structure disposed on a substrate, wherein the stacked structure comprises a plurality of gate electrodes;
a plurality of main separation lines passing through the stacked structure in a first direction substantially perpendicular to an upper surface of the substrate, extending in a second direction substantially parallel to the upper surface of the substrate and intersecting the stacked structure, and having edge end portions located outside of the stacked structure;
a plurality of first secondary separation lines passing through the stacked structure in the first direction, extending in the second direction, and having edge end portions located on outer sides of the stacked structure;
a plurality of second secondary separation lines passing through the stacked structure in the first direction, and having inside end portions facing the first secondary separation lines; and
a structure facing the edge end portions of the main separation lines and the edge end portions of the first secondary separation lines,
wherein upper surfaces of the structure are coplanar with upper surfaces of the main separation lines and upper surfaces of the first secondary separation lines.

16. The semiconductor device according to claim 15, wherein a length of each of the main separation lines in the second direction is greater than a length of each of the first secondary separation lines in the second direction.

17. The semiconductor device according to claim 15, further comprising:
an isolation pattern disposed outside of the stacked structure and disposed in the substrate,
wherein at least a portion of the structure is disposed on the isolation pattern.

18. The semiconductor device according to claim 17, wherein the first secondary separation lines and the main separation lines are spaced apart from the isolation pattern.

19. The semiconductor device according to claim 17, wherein the first secondary separation lines, the second secondary separation lines, the main separation lines, and the structure commonly comprise a separation core pattern, and insulating spacers surrounding side surfaces of the separation core pattern.

20. A semiconductor device, comprising:
a memory array region disposed on a substrate, and an extension region disposed adjacent to the memory array region;
a stacked structure disposed in the memory array region and the extension region,
wherein the stacked structure comprises a plurality of gate electrodes spaced apart from one another and stacked in a first direction in the memory array region,
wherein the first direction is substantially perpendicular to an upper surface of the substrate,
wherein the gate electrodes extend into the extension region and comprise a plurality of pads disposed in a stepped shape in the extension region;
a plurality of memory vertical structures extending in the first direction and passing through the gate electrodes in the memory array region;
a plurality of main separation lines intersecting the memory array region and the extension region and separating the stacked structure in a second direction;
a plurality of secondary separation lines passing through the stacked structure in the extension region; and
a structure disposed on the substrate and disposed outside of the stacked structure,
wherein the main separation lines and the secondary separation lines comprise edge end portions extending in a third direction from the extension region and located on outer sides of the stacked structure,
wherein the structure comprises outer side end portions facing the edge end portions, wherein upper surfaces of the main separation lines, the secondary separation lines, and the structure are coplanar with one another and formed of the same material.

* * * * *